United States Patent
Ma et al.

(10) Patent No.: US 9,553,642 B2
(45) Date of Patent: Jan. 24, 2017

(54) APPARATUS AND METHODS FOR CROSS-POLARIZED TILT ANTENNAS

(71) Applicant: Futurewei Technologies, Inc., Plano, TX (US)

(72) Inventors: Zhengxiang Ma, Summit, NJ (US); Leonard Piazzi, Denville, NJ (US); Renjian Zhao, Acton, MA (US); Jian Wang, Bridgewater, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/609,251

(22) Filed: Jan. 29, 2015

(65) Prior Publication Data

US 2016/0028455 A1     Jan. 28, 2016

Related U.S. Application Data

(60) Provisional application No. 62/029,902, filed on Jul. 28, 2014.

(51) Int. Cl.
*H04B 7/04*     (2006.01)
*H04B 7/10*     (2006.01)
(Continued)

(52) U.S. Cl.
CPC ............ *H04B 7/0456* (2013.01); *H01Q 1/246* (2013.01); *H01Q 25/001* (2013.01); *H04B 1/04* (2013.01);
(Continued)

(58) Field of Classification Search
CPC ... H04B 7/0487; H04B 7/0413; H04B 7/0417; H04B 7/0452; H04B 7/0456; H04B 7/06; H04B 7/0619; H04B 7/0636; H04B 7/0617; H04B 7/0469; H04B 7/10; H01Q 25/001; H01Q 1/246
(Continued)

(56) References Cited

U.S. PATENT DOCUMENTS 5,440,318 A * 8/1995 Butland .................. H01Q 3/20
                                                                 342/375
2009/0058725 A1* 3/2009 Barker ................ H04B 7/0408
                                                                 342/372
(Continued)

FOREIGN PATENT DOCUMENTS

CN     101826662 A     9/2010
CN     102273013 A     12/2011
(Continued)

OTHER PUBLICATIONS

Ng, B., et al., "Fulfilling the Promise of Massive MIMO With 2D Active Antenna Array," IEEE Globecom Workshops, Dec. 3-7, 2012, pp. 691-696.
(Continued)

*Primary Examiner* — Betsy Deppe
(74) *Attorney, Agent, or Firm* — Slater Matsil, LLP

(57) ABSTRACT

Embodiments are provided for cross-polarized antennas design with different down tilt angles that support versatile functionality, such as for MIMO or beamforming. An embodiment antenna circuit comprises a baseband signal processor, a pair of RF transmitters coupled to the baseband signal processor, a pair of PAs coupled to the RF transmitters, a 90°/180° hybrid coupler coupled to the RF transmitters, a pair of duplexers and two antennas coupled to the PAs. The two antennas are down tilted at different down tilt angles. A pair of signals is generated using the baseband signal processor, transmitted by the RF transmitters, and amplified using the PAs. Additionally, a 90° or 180° phase difference is introduced into the signals using the 90°/180° hybrid coupler. After the amplifying and introducing the phase difference, the signals are polarized at two different polarizations and down tilted at different down tilt angles using the two antennas.

25 Claims, 16 Drawing Sheets

(51) Int. Cl.
*H01Q 1/24* (2006.01)
*H01Q 25/00* (2006.01)
*H04L 5/14* (2006.01)
*H04B 1/04* (2006.01)

(52) U.S. Cl.
CPC . *H04B 7/10* (2013.01); *H04L 5/14* (2013.01); *H04B 2001/045* (2013.01)

(58) Field of Classification Search
USPC .............................. 375/267, 299; 455/562.1
See application file for complete search history.

(56) References Cited

U.S. PATENT DOCUMENTS

| | | |
|---|---|---|
| 2010/0227647 A1 | 9/2010 | Shimizu et al. |
| 2011/0103504 A1 | 5/2011 | Ma |

FOREIGN PATENT DOCUMENTS

| | | |
|---|---|---|
| CN | 102544763 A | 7/2012 |
| JP | 2001292023 A | 10/2001 |
| WO | 2008020178 A1 | 2/2008 |

OTHER PUBLICATIONS

International Search Report received in Application No. PCT/CN2015/083404, mailed Sep. 29, 2015, 11 pages.

\* cited by examiner

APPARATUS AND METHODS FOR CROSS-POLARIZED TILT ANTENNAS

This application claims the benefit of U.S. Provisional Application No. 62/029,902 filed on Jul. 28, 2014 by Zhengxiang Ma, et al. and entitled "Apparatus and Methods for Cross-Polarized Tilt Antennas," which is hereby incorporated herein by reference as if reproduced in its entirety.

TECHNICAL FIELD

The present invention relates to network communications, and, in particular embodiments, to an apparatus and methods for cross-polarized tilt antennas.

BACKGROUND

In cross-polarized antennas systems for wireless or cellular communications, such as for Long Term Evolution (LTE), the antenna is designed to emit two cross-polarized radio frequency (RF) beams at +45° and −45° polarization respectively. Further, the two polarizations are set to the same down tilt angle, for example 8° for each of the two polarized beams. To ensure proper multiple-input and multiple-output (MIMO) operation, multiple cross-polarized antennas need to have the same coverage, which is significantly impacted by their down tilt angles. However, the current setup of the cross-polarized antennas, with a fixed down tilt angle of the two polarized beams, does not offer any MIMO or beamforming functionality in the elevation dimension. There is a need for an improved cross-polarized antennas design that provides versatile functionality for MIMO or beamforming in general, such as versatile elevation or three-dimensional coverage.

SUMMARY OF THE INVENTION

In accordance with an embodiment, a method by an antenna circuit comprises generating a pair of signals using a baseband digital circuit, transmitting the signals using a pair of respective radio frequency (RF) transmitters coupled to the baseband digital circuit, and amplifying the signals using a pair of respective power amplifiers (PAs) coupled to the RF transmitters. The method further comprises introducing into the signals one of a 90° and 180° phase difference using a 90° or 180° hybrid coupler (also referred to herein as a hybrid for short) function block coupled to the RF transmitters. After the amplifying and introducing the one of 90° and 180° phase difference, the signals are polarized at two different polarizations using single-column cross-polarized antennas coupled to the PAs. The signals are also tilted at different down tilt angles using the single-column cross-polarized antennas, and sent as RF beams after the polarizing and the down tilting using the single-column cross-polarized antennas.

In accordance with another embodiment, an antenna circuit comprises a baseband signal processor, a pair of RF transmitters coupled to the baseband signal processor, and a pair of PAs coupled to the pair of RF transmitters. The antenna circuit further includes a 90° or 180° hybrid coupled to the pair of RF transmitters, a pair of duplexers (DUPs) coupled to the pair of PAs, and two antennas coupled to the pair of PAs, wherein the two antennas are down tilted at different down tilt angles.

In accordance with yet another embodiment, an antenna circuit comprises a baseband signal processor including four output ports, a first pair of RF transmitters coupled to first two ports of the four output ports, a second pair of RF transmitters coupled to second two ports of the four output ports, a first pair of PAs coupled to the first pair of RF transmitters, a second pair of PAs coupled to the second pair of RF transmitters, a first 90° or 180° hybrid coupled to the first pair of RF transmitters, a second 90° or 180° hybrid coupled to the second pair of RF transmitters, a first pair of DUPs coupled to the first pair of PAs, and a second pair of DUPs coupled to the second pair of PAs. The antenna circuit further comprises first cross-polarization antennas on a first column coupled to the first pair of PAs, and second cross-polarization antennas on a second column coupled to the second pair of PAs. The first cross-polarized antennas are down tilted at different down tilt angles, and the second cross-polarized antennas are also down tilted at different down tilt angles.

The foregoing has outlined rather broadly the features of an embodiment of the present disclosure in order that the detailed description that follows may be better understood. Additional features and advantages of embodiments will be described hereinafter, which form the subject of the claims. It should be appreciated by those skilled in the art that the conception and specific embodiments disclosed may be readily utilized as a basis for modifying or designing other structures or processes for carrying out the same purposes of the various embodiments disclosed herein. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The designing and using of the presently preferred embodiments are discussed in detail below. It should be appreciated, however, that the present disclosure provides many applicable concepts that can be embodied in a wide variety of specific contexts. The specific embodiments discussed are merely illustrative of specific ways to design and use the disclosure, and do not limit the scope of the claims.

Figure 1:
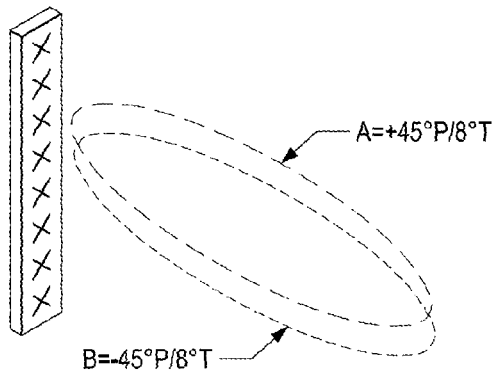
FIG. 1 is a diagram illustrating a cross-polarized antennas system.

FIG. 1 shows a cross-polarized antennas system that can be used for LTE, referred to commonly as a two transmitters (2T) system. The system setup employs cross-polarized antennas at ±45°. The two polarizations are set to the same down tilt angle, e.g., 8°.

Figure 2:
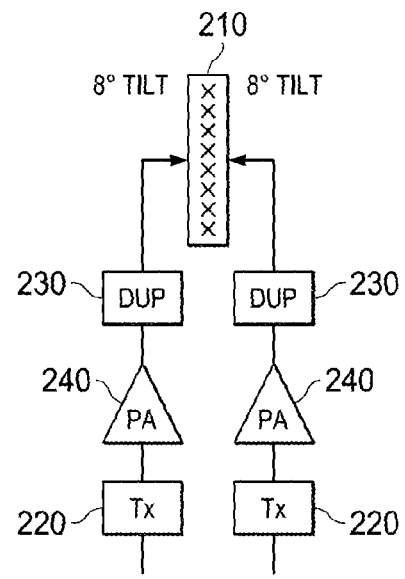
FIG. 2 is a diagram illustrating the components design of the cross-polarized antennas system of FIG. 1.

FIG. 2 shows components design of the cross-polarized antennas system of FIG. 1. The design includes a single column 210 of cross-polarized antennas at ±45°. The single column antenna 210 is coupled to two radio frequency (RF) transmitters (Tx) 220. Each RF Tx 220 is coupled, via a corresponding power amplifier (PA) 230 and a duplexer (DUP) 240, to one of the two polarizations in the antenna column 210, as shown.

To support proper MIMO operation, multiple antennas of the system above with similar setup need to have the same coverage. However, due to the fixed down tilt angle restriction, the set-up of FIG. 1 does not offer flexibility for MIMO or beamforming functionality in the elevation dimension. Embodiment systems and methods are provided herein to provide a cross-polarized antennas design with different down tilt angles that support versatile functionality for MIMO or beamforming. The embodiments below are presented in the context of LTE systems. However, the schemes provided can be extended to any suitable cellular systems, such as for High Speed Packet Access (HSPA), or other suitable wireless systems, such as for Wireless Local Area Network (WLAN) or WiFi.

Figure 3:
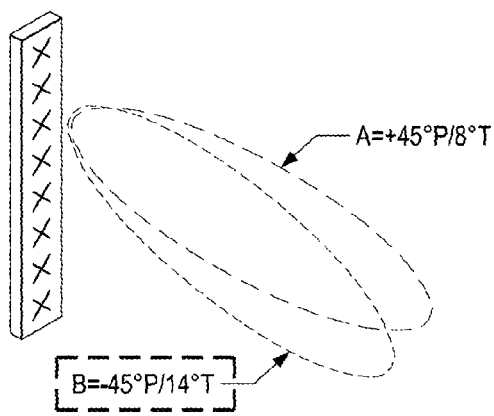
FIG. 3 is a diagram illustrating an embodiment of an improved cross-polarized antennas system.

FIG. 3 shows an embodiment of an improved cross-polarized antennas system allowing different down tilt angles for the two polarizations, also referred to herein as cross-polarized (XP) user specific tilt (UST) antennas. The phrase "user specific" implies that the down tilting of the antennas is in accordance of serving different users or group of users, and the down tilt angles may be set according to locations of users. Specifically, the down tilt of the two cross-polarized antennas in the column is set to different angles, such as 8° and 14° in this example. This allows beam steering capability in the elevation direction, for instance through standard precoding MIMO methods in LTE.

Figure 4:
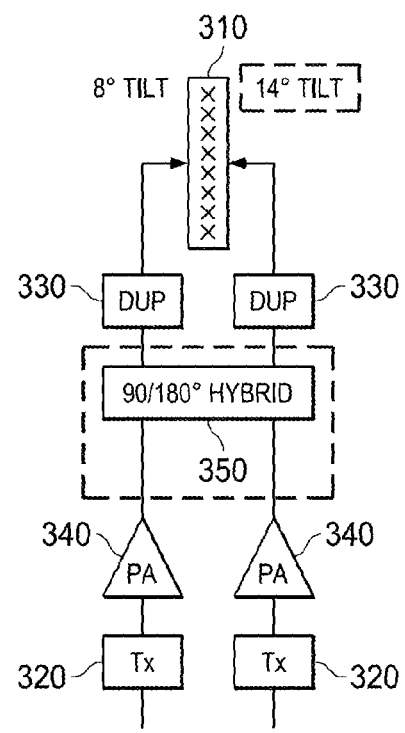
FIG. 4 is a diagram illustrating an embodiment of components design of the improved cross-polarized antennas system of FIG. 3.

FIG. 4 shows an embodiment of components design of the improved cross-polarized antennas system of FIG. 3. A separate Tx 320 is coupled, via a corresponding PA 340 and a respective DUP 330, to each of the two polarizations in the antenna column 310. Additionally, a 3 dB hybrid coupler 350 (either a 90° or 180° hybrid) is positioned between both PAs 340 and both DUPs 330, as shown. The hybrid 350 serves to equalize the coverage of the two baseband ports driving the two transmitters 320. This also allows power sharing between the two cross-polarized antennas so that the full power of both PAs 340 could be directed to any antenna if desired.

Figure 5:
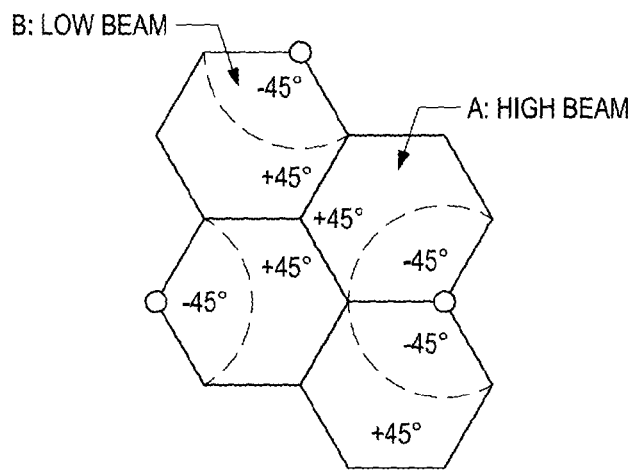
FIG. 5 is a diagram illustrating an embodiment of coverage areas by the improved cross-polarized antennas system of FIG. 3.

FIG. 5 shows an embodiment of coverage areas by the improved cross-polarized antennas system of FIG. 3. The coverage areas represent an example of cell layout with the different down tilt angles, e.g., 8° for low beam areas and 14° for high beam areas. Table 1 below illustrates the 2T codebook and the corresponding user data beams that can be achieved using the system of FIG. 3. The table shows that different Precoding Matrix Indicators (PMIs) correspond to beams with different down tilt angles and other characteristics.

TABLE 1

2T precoding codebook and corresponding user data beams

| 2T Precoding Codebook (1 layer) | | | Resulted Beam Description for 90° Hybrid Port1 = A + jB and Port2 = B + jA |
|---|---|---|---|
| 2 | [1, −j] | 2A | P + 45° T8° beam |
| 3 | [1, j] | 2jB | P − 45° T14° beam |
| 0 | [1, 1] | (1 + j)(A + B) | "Vertically" polarized with down tilt angle of 11° |
| 1 | [1, −1] | (1 − j)(A − B) | "Horizontally" polarized with down tilt angle of 11° |

Figure 6:
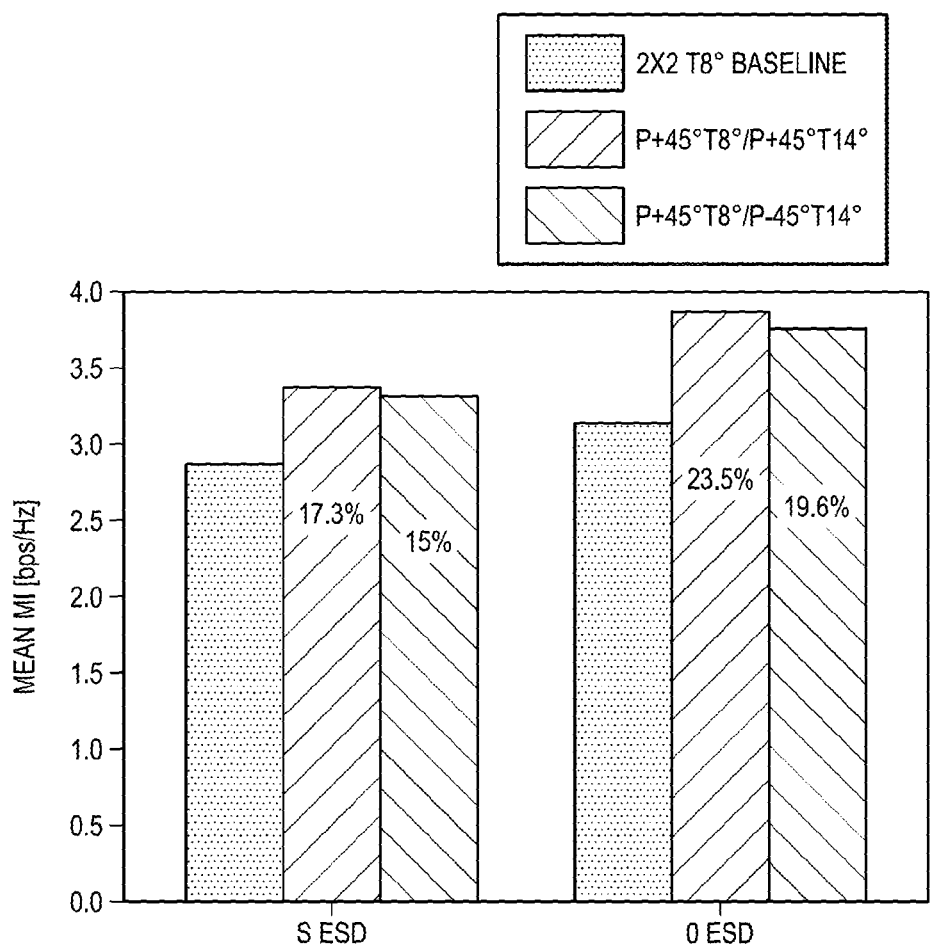
FIG. 6 is a chart illustrating simulation results of average user throughput for typical and improved cross-polarized antennas systems.
Figure 7:
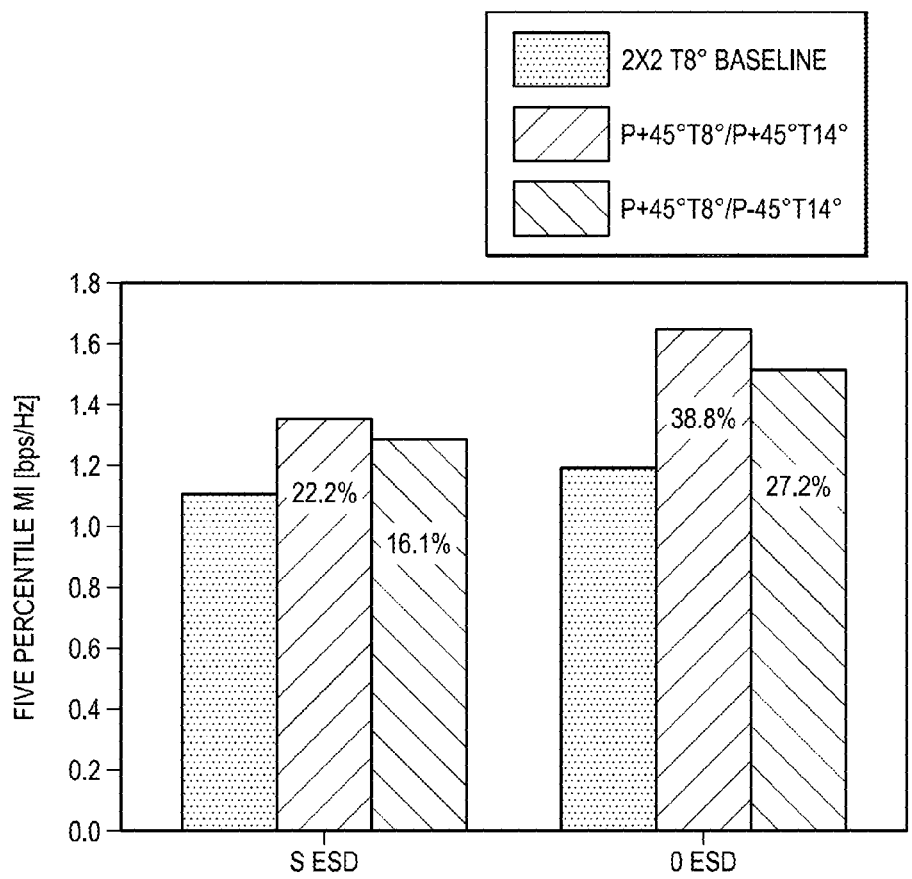
FIG. 7 is a chart illustrating simulation results of edge user throughput for typical and improved cross-polarized antennas systems.

FIGS. 6 and 7 show simulation results from single user simulations based on the design of FIG. 2 and the improved design of FIG. 4. FIG. 6 shows the results for average user throughput and FIG. 7 shows the results for the edge users (defined as 5 percentile users) throughput. Two sets of data are shown labeled as 0 ESD and S ESD. The former set assumes no elevation angle spread, while the latter set assumes an nonzero elevation angle spread as described in the publication entitled: "Fulfilling the promise of massive MIMO with 2D active antenna array," by Boon Loong Ng, et al., pp 691-696, Globecom Workshops (GC Wkshps), 2012 IEEE, which is incorporated herein by reference. Within each set of data, 3 different antenna designs are shown. The bar on the left shows the standard 2T system with fixed 8° down tilt angle (labeled 2×2 T8° Baseline). The bar in the middle shows an antenna system that has the same-polarized (SP) antennas both at +45° with 8° and 14° down tilt angles. The bar on the right shows the cross-polarized (XP) antennas at ±45° with 8° and 14° down tilt angles. Better than about 10% gain is obtained with the XP antennas in both average throughput (FIG. 6) and edge throughput (FIG. 7) in comparison to the standard 2T system. The performance of the SP antennas is slightly better than the performance of the XP antennas but is also more sensitive to the elevation angle spread.

Figure 8:
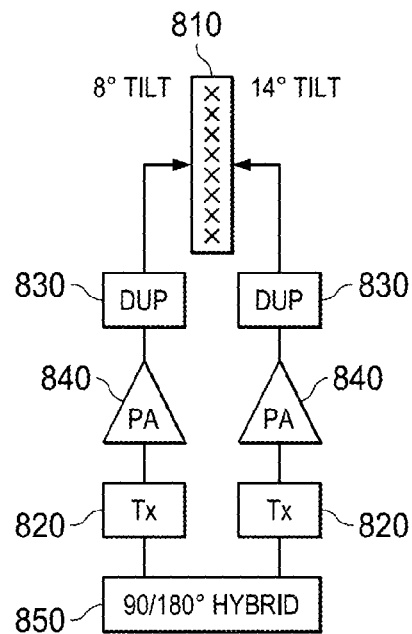
FIG. 8 is a diagram illustrating another embodiment of components design of the improved cross-polarized antennas system of FIG. 3.

FIG. 8 shows another embodiment of components design of the improved cross-polarized antennas system of FIG. 3. A separate Tx 820 is coupled, via a corresponding PA 840 and a respective DUP 830, to each of the two polarizations in the antenna column 810. Additionally, a 3 dB hybrid 850 (either 90° or 180°) is coupled to the input of the two transmitters 820. The function of the 3 dB hybrid 850 can be implemented in the digital baseband, which allows the coupling of the two baseband ports and equalizing the coverage of the two ports. However, in this case, the maximum power that can be delivered to one polarization is limited by the power of one PA 840. Thus, the utilization of the PA resource is reduced by half in comparison to the design of FIG. 4. If the hybrid 810 is placed after the PAs 840 (as in FIG. 4), each polarization can be driven with the combined power of both PAs 840, achieving full utilization of the PA resource.

Figure 9:
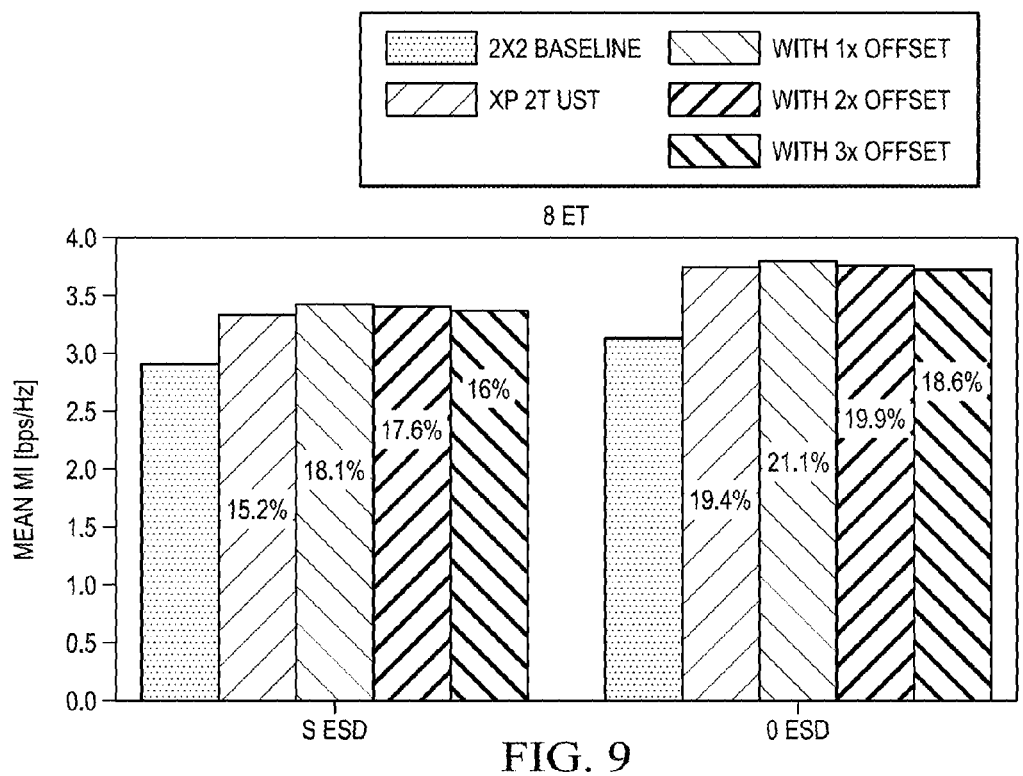
FIG. 9 is a chart illustrating simulation results for typical and improved cross-polarized antennas systems.
Figure 10:
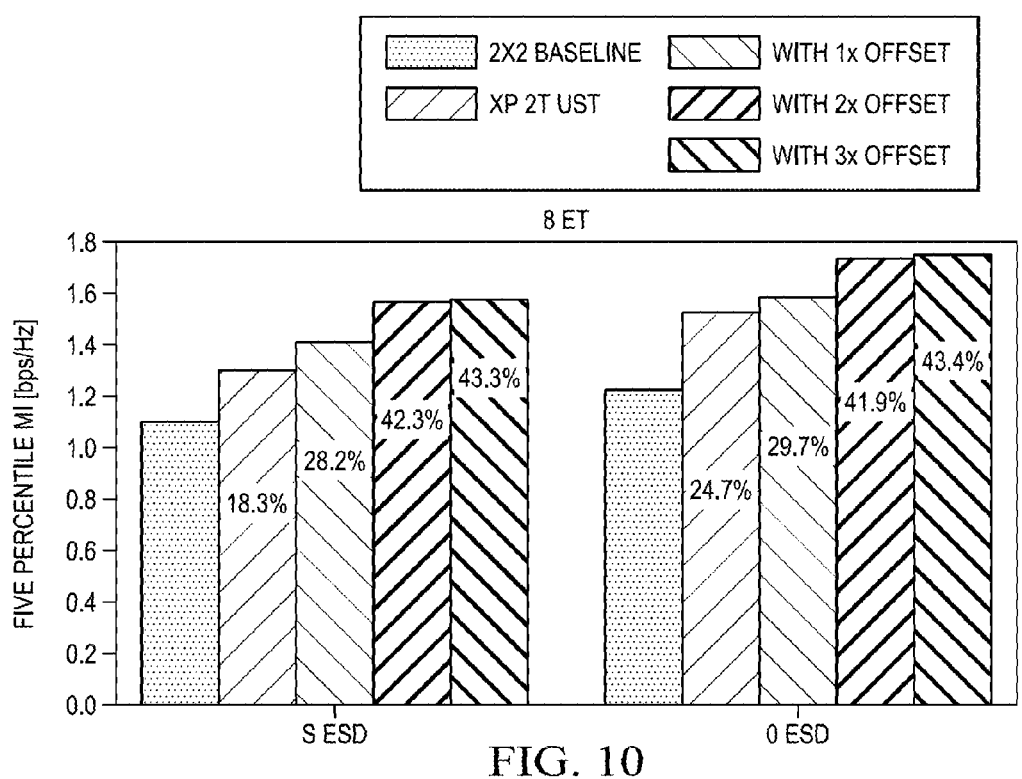
FIG. 10 is a chart illustrating simulation results for typical and improved cross-polarized antennas systems.

In user equipment (UE) receiver processing, the UE sends, to the base transceiver station (BTS), the best PMI by selecting the antenna beam that provides the best throughput. However, if the UE receiver can factor in the impact of its data beams to the rest of the network, and feedback the PMI which provides the best overall network throughput, the overall network edge performance can be significantly enhanced, for example by more than about 30%. This can be accomplished by the UE receiver adding a PMI dependent offset to its calculation of the achievable throughput for all the PMI codewords. This modifies the PMI feedback from UE, and is referred to herein as intelligent PMI selection. FIGS. 9 and 10 show simulation results for various antenna systems including 2×2 Baseline (FIG. 1), XP 2T UST (FIG. 3), and XP 2T UST with intelligent PMI selection with different offset values. The results are shown for average throughput (FIG. 9) and edge throughput (FIG. 10) for 0 ESD and S ESD case.

Figure 11:
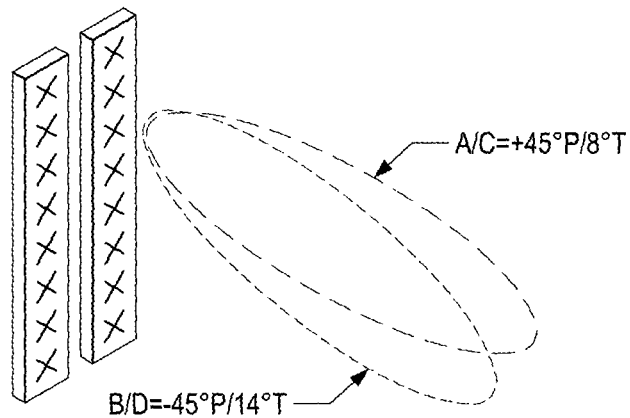
FIG. 11 is a diagram illustrating an embodiment of an improved cross-polarized antennas system with two columns.

FIG. 11 shows an embodiment of an improved cross-polarized antennas system with two columns. The system allows different down tilt angles for the two polarizations in each column. For each column, the down tilt of the two cross-polarized antennas (at ±45°) is set to different angles, for example at 8° and 14° (similar to the scheme described above for the single column system of FIG. 3).

Figure 12:
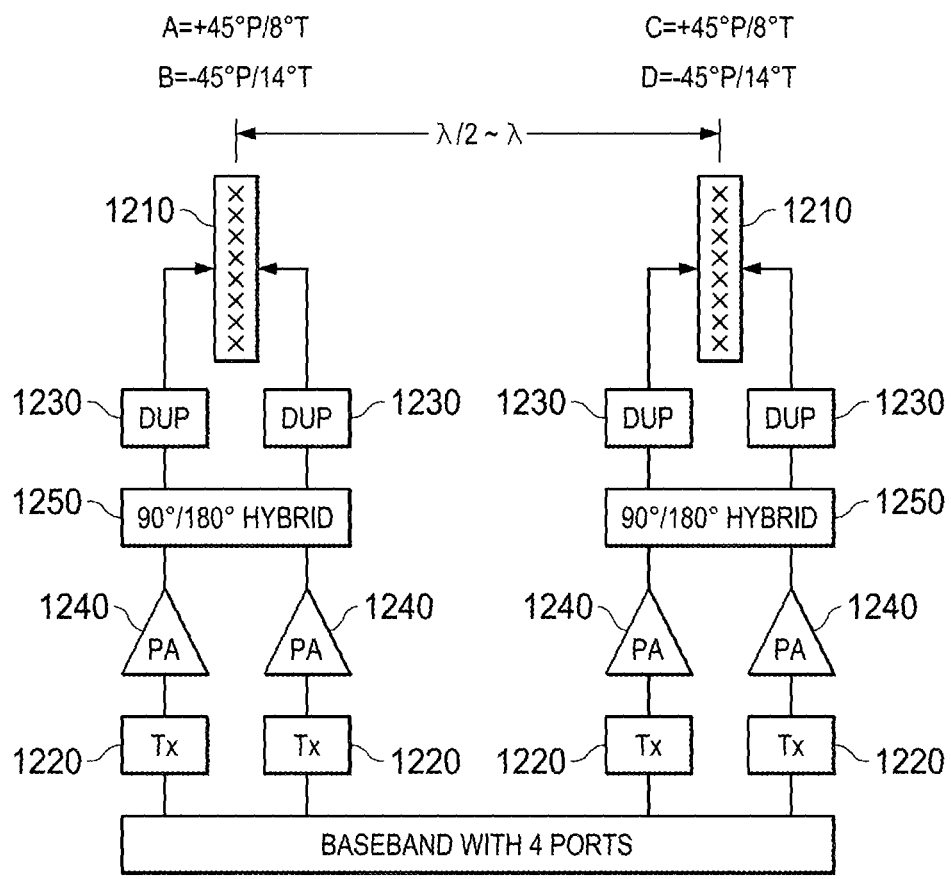
FIG. 12 is a diagram illustrating an embodiment of components design of the improved cross-polarized antennas system of FIG. 11 using two columns.

FIG. 12 shows an embodiment of components design of the improved cross-polarized antennas system of FIG. 11. The design for each column is similar to the design of FIG. 4. For each antenna column 1210, a separate Tx 1220 is coupled, via a corresponding PA 1240 and a respective DUP 1230, to each of the two polarizations in that antenna column 1210. Additionally, for each column 1210, a 3 dB hybrid 1250 (either 90° or 180°) is positioned between both PAs 1240 and both DUPs 1230. The system and design above can be extended to any number of suitable columns (e.g., 4 or 8 columns). The spacing between the two columns can be from half an operation wavelength (λ/2) to a full wavelength (λ). Such design allows for three-dimensional (3D) beamforming capability using 4 (or more) transmitters. Table 2 below shows an example configuration of the hybrid for each port (corresponding each of the 4 Tx branches in FIG. 12).

TABLE 2

Hybrid configuration in XP 2T with 2 columns and different down tilt angles

| Hybrid Type | Port 0 | Port 1 | Port 2 | Port 3 |
|---|---|---|---|---|
| 90° | A + j * B | C + j * D | A − j * B | C − j * D |
| 180° | A + B | C + D | A − B | C − D |

Figure 13:
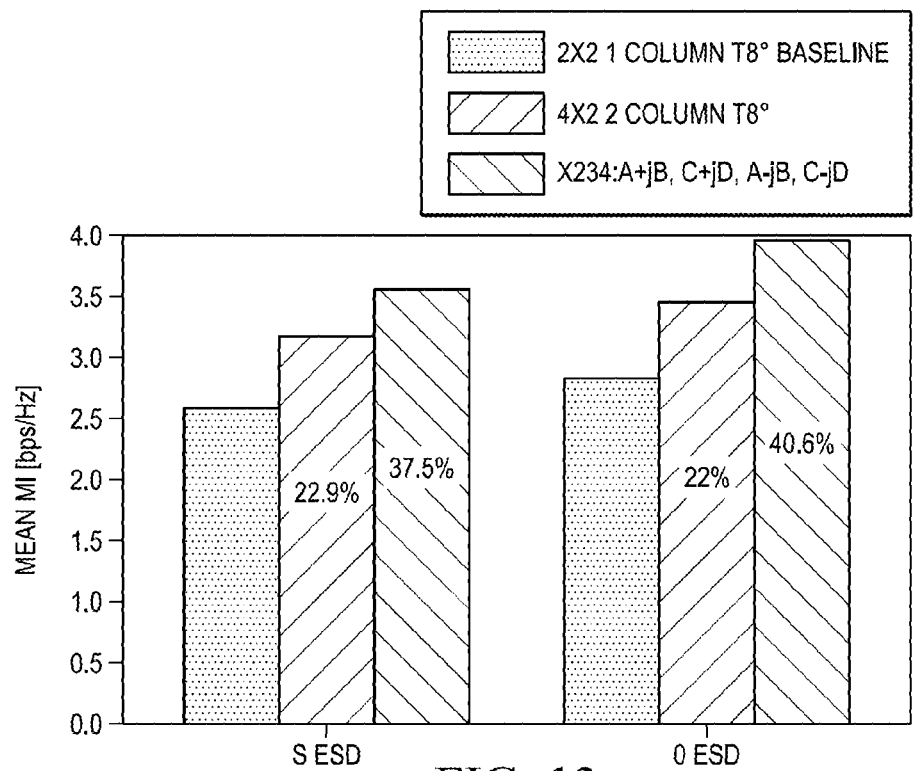
FIG. 13 is a chart illustrating simulation results of average user throughput for typical and improved cross-polarized antennas systems.
Figure 14:
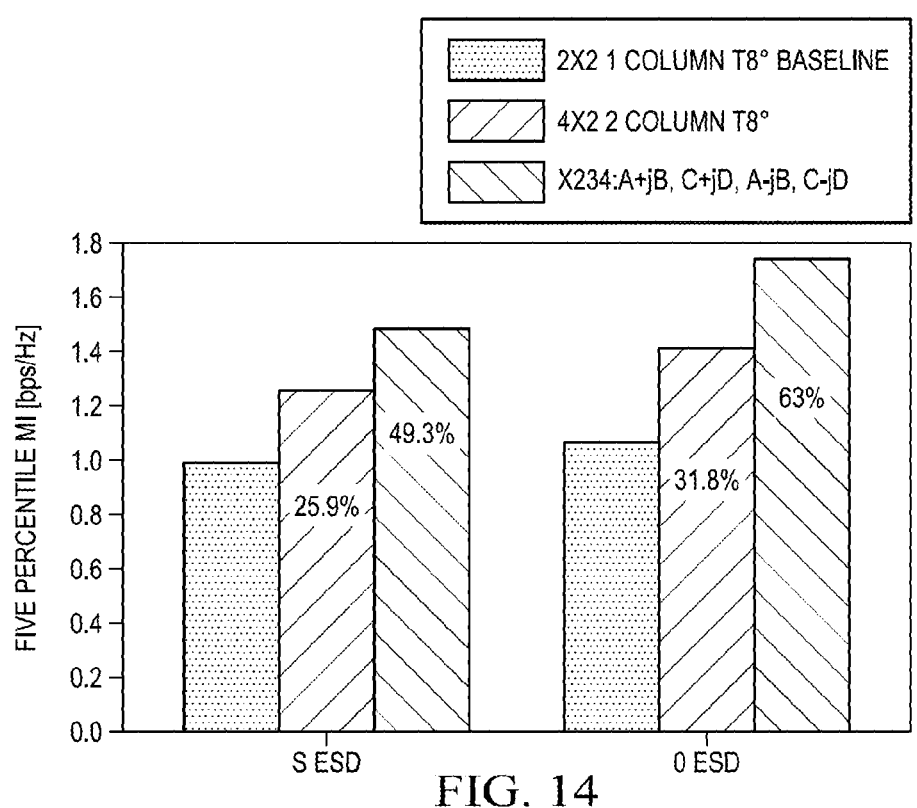
FIG. 14 is a chart illustrating simulation results of edge user throughput for typical and improved cross-polarized antennas systems.

FIGS. 13 and 14 show simulation results for various antenna systems including a 2×2 Baseline with 1 column and 1 down tilt angle at 8° (FIG. 1), a 4×2 system with 2 columns and 1 down tile angle at 8°, and the system of FIG. 11 with 2 columns and 2 down tilt angles at 8° and 14° and a 90° hybrid port configuration A+jB, C+jD, A−jB, C−jD (labeled X234). The results are shown for average throughput (FIG. 13) and edge throughput (FIG. 14) for 0 ESD and S ESD. For all cases, higher throughput is achieved using the system of FIG. 11 (X234). Better than about 35% gain is obtained with the X234 system in average throughput, and more than about 45% gain in edge throughput. The improvement over a standard 4T column system (4×2 system) is about 12% in average throughput, and about 18% in edge throughput. This gain is similar to that of the XP 2T UST over standard 2T. The overall gain is a multiplication effect of the azimuth and elevation beam forming, e.g., due to 3D beamforming. Similar results are also observed for the 180° hybrid.

Figure 15:
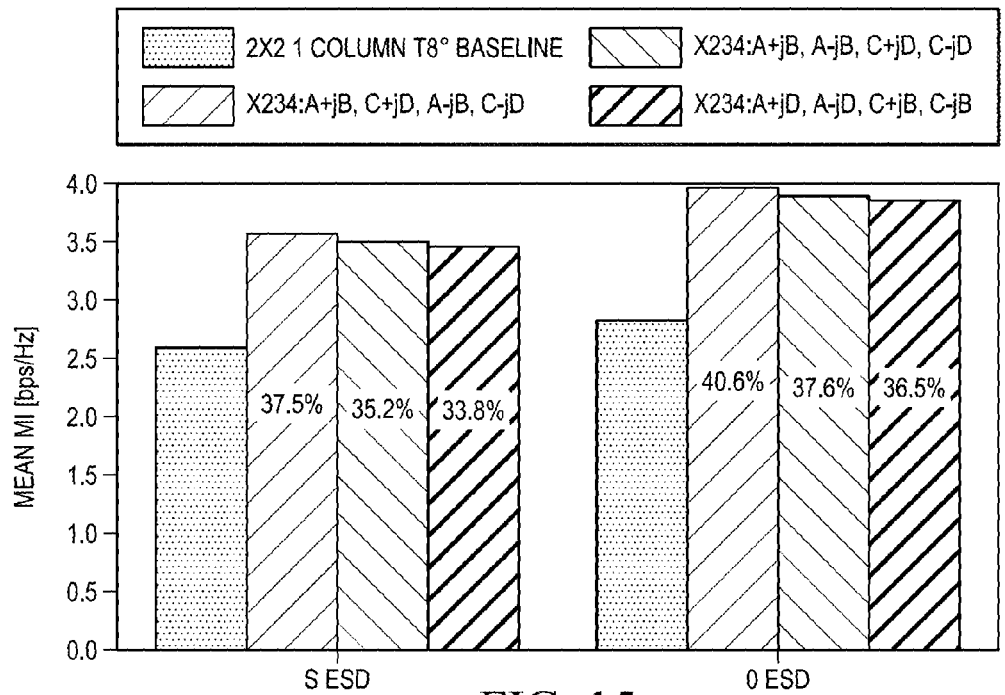
FIG. 15 is a chart illustrating simulation results of average user throughput for typical and improved cross-polarized antennas systems.
Figure 16:
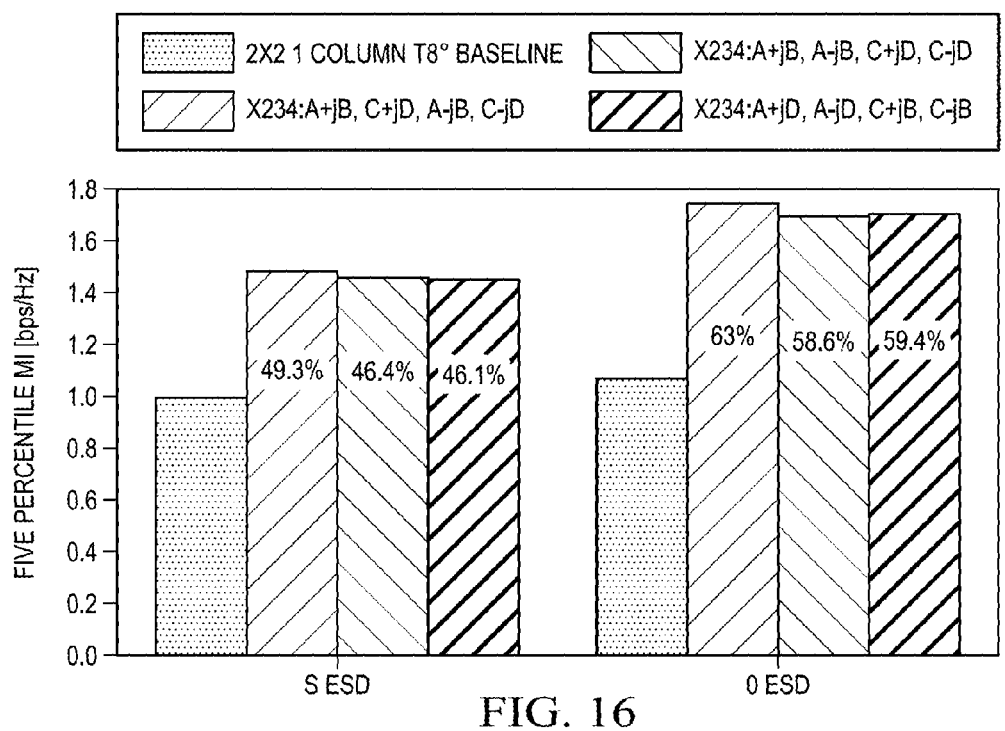
FIG. 16 is a chart illustrating simulation results of edge user throughput for typical and improved cross-polarized antennas systems.

FIGS. 15 and 16 show simulation results for the system of FIG. 11 with 2 columns and 2 down tilt angles, also referred to herein as X234 system. Three additional implementation options are examined, where the port assignment is changed to offer different degrees of freedom for azimuth and elevation dimension. The implementation options include a first case with 8 beams in the horizontal dimension and 4 beams in the vertical dimension, and a second case with 4 beams in the horizontal dimension and 8 beams in the vertical dimension. More degree of freedom in the horizontal dimension can offer an advantage. The hybrids of the system can be used to couple the different polarizations on the same or different columns. The options also include a third case where the hybrids couple the +45° polarization of column 1 with the −45° polarization of column 2, and the −45° polarization of column 1 with the +45° polarization of column 2. The hybrids that cross the two columns can cause some difference in performance. Table 3 below shows the port configurations for the three implementation cases.

TABLE 3

Port configurations of simulation cases of FIGS. 15 and 16

| Case | Port 0 | Port 1 | Port 2 | Port 3 |
|---|---|---|---|---|
| 1 | A + j * B | C + j * D | A − j * B | C − j * D |
| 2 | A + j * B | A − j * B | C + j * D | C − j * D |
| 3 | A + j * D | A − j * D | C + j * B | C − j * B |

Figure 17:
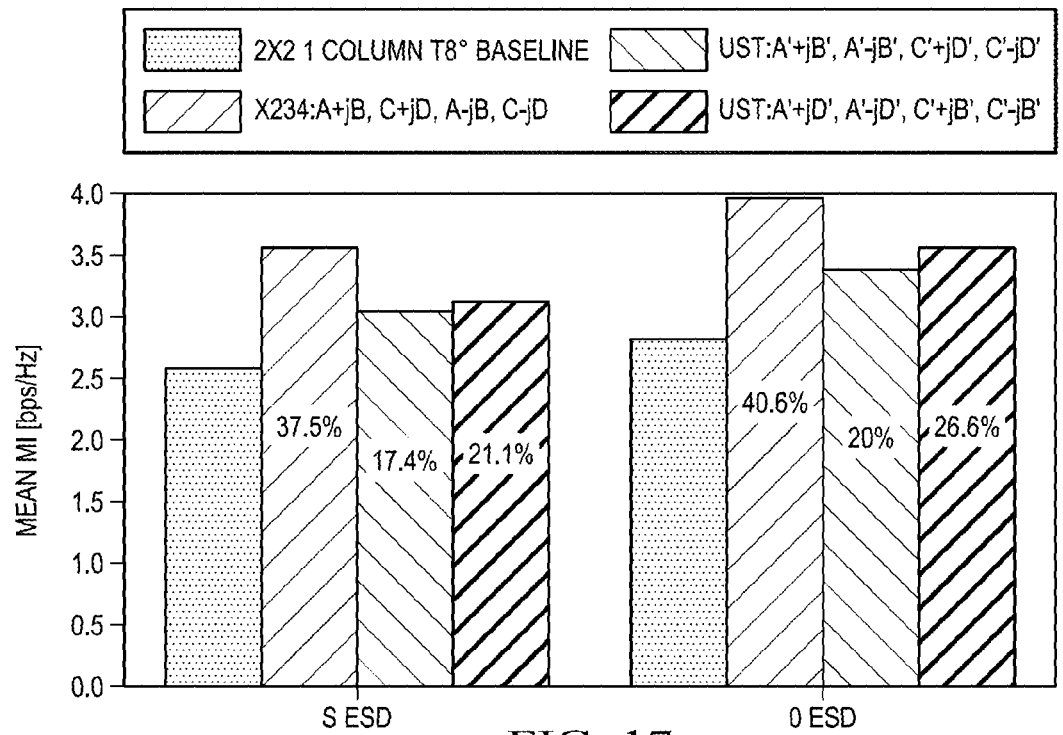
FIG. 17 is a chart illustrating simulation results of average user throughput for typical and improved cross-polarized antennas systems.
Figure 18:
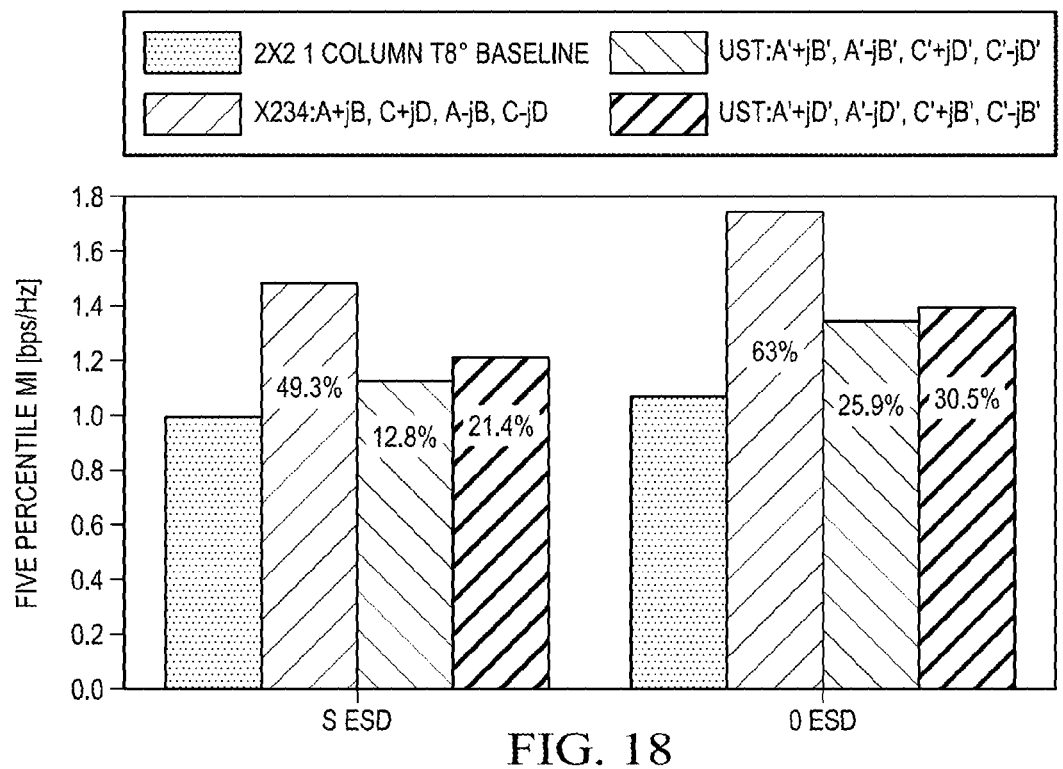
FIG. 18 is a chart illustrating simulation results of edge user throughput for typical and improved cross-polarized antennas systems.

FIGS. 17 and 18 show simulation results for the system of FIG. 11 with more implementation options. The down tilt angles of the same polarization antennas on the two columns are kept the same to enable horizontal beamforming. If the two columns are down tilted differently, the system becomes a cross-polarized 2 column with 4 transmitters and fixed down tilt angle and has lower performance. Table 4 below shows the port configurations for the cases examined in FIGS. 17 and 18, where A'=+45° polarization at 8° down tilt on column 1, B'=−45° polarization at 8° down tilt on column 1, C'=+45° polarization at 14° down tilt on column 2, and D'=−45° polarization at 14° down tilt on column 2.

TABLE 4

Port configurations of simulation cases of FIGS. 17 and 18

| Case | Port 0 | Port 1 | Port 2 | Port 3 |
|---|---|---|---|---|
| 1 | A + j * B | C + j * D | A − j * B | C − j * D |
| 2 | A' + j * B' | A' − j * B' | C' + j * D' | C' − j * D' |
| 3 | A' + j * D' | A' − j * D' | C' + j * B' | C' − j * B' |

Figure 19:
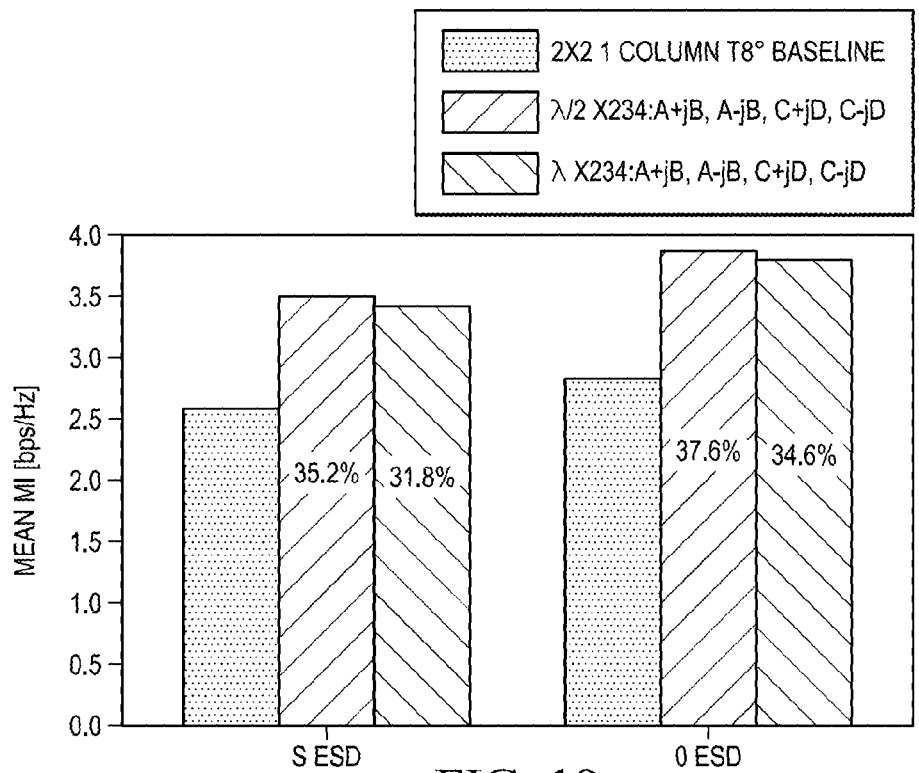
FIG. 19 is a chart illustrating simulation results of average user throughput for typical and improved cross-polarized antennas systems.
Figure 20:
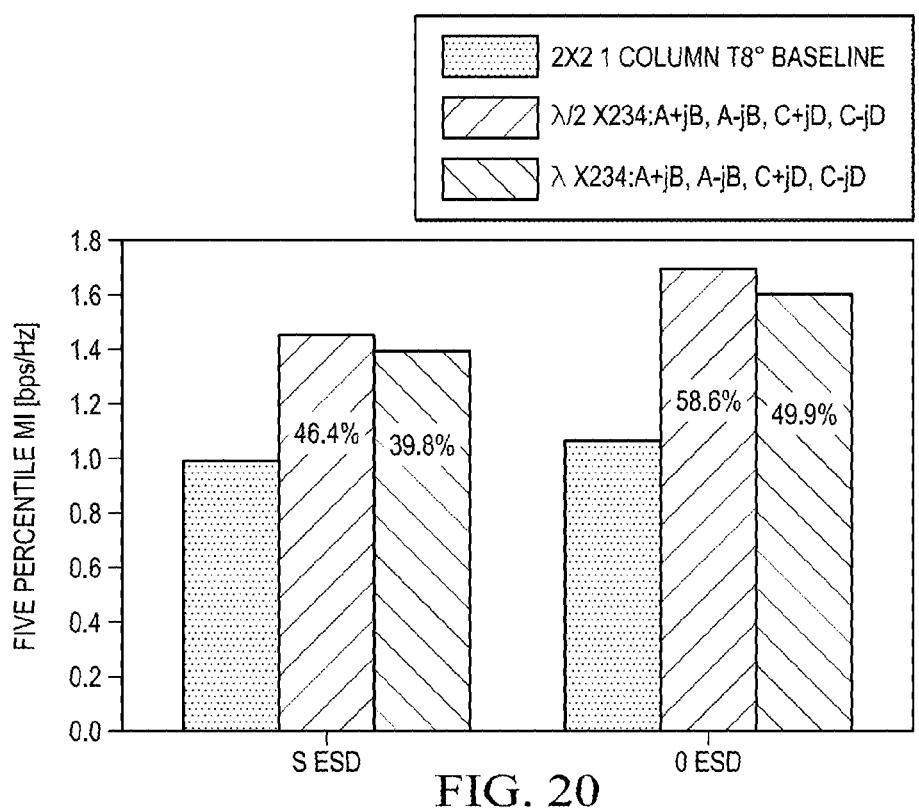
FIG. 20 is a chart illustrating simulation results of edge user throughput for typical and improved cross-polarized antennas systems.

The simulation results presented above are all based on λ/2 spacing between the two columns. In an actual implemented system, the spacing may be greater. As the spacing increases, the performance may decrease if the gain comes from beamforming. FIGS. 19 and 20 show simulation results with λ spacing between the two columns. The results show a decrease in throughput.

For scenarios with users distribution having significant elevation distribution, such as in tall buildings, the 2 columns with different down tilt angles can be used to split a sector into two elevation coverage zones, which is referred to herein as vertical sectorization, offering sectorization gain. The X234 system also has potential to further improve cell throughput through better multi-user-MIMO (MU-MIMO) performance. Further, users can intelligently feedback the PMI selection by considering not only their own performance, but also the performance of the entire network.

Figure 21:
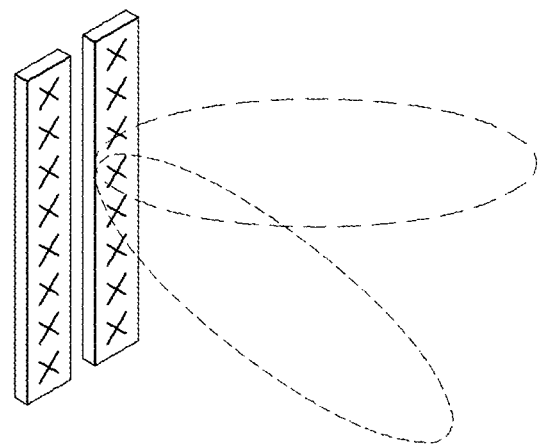
FIG. 21 is a diagram illustrating an embodiment of an improved cross-polarized antennas system with vertical sectorization.
Figure 22:
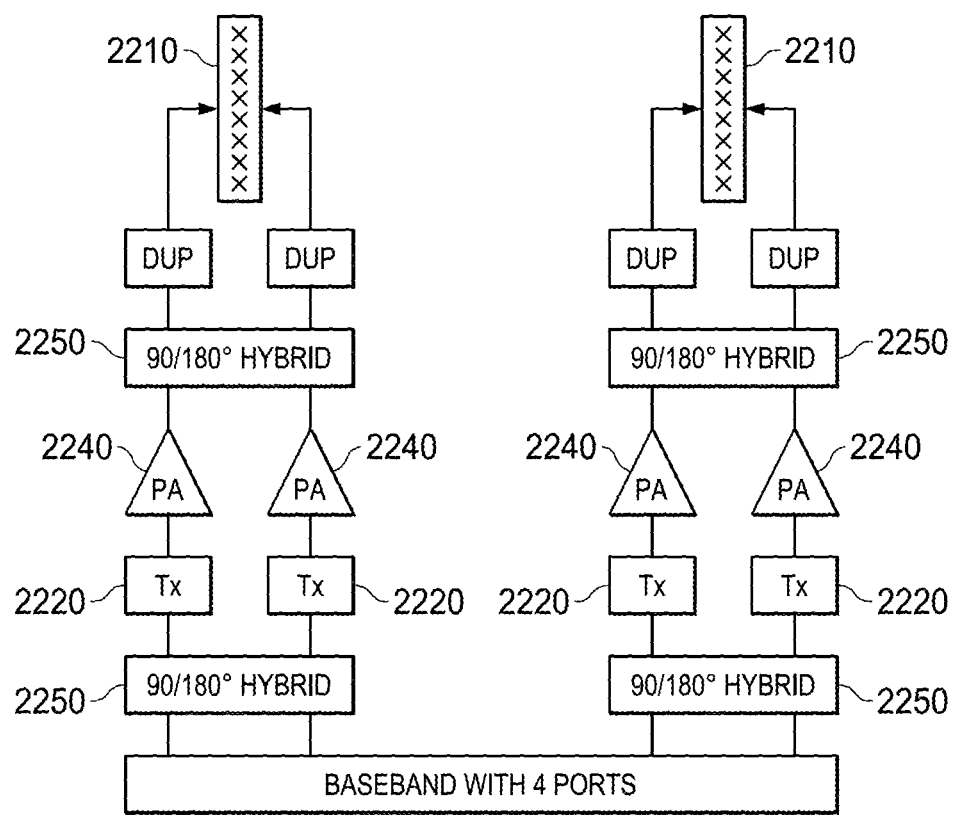
FIG. 22 is a diagram illustrating an embodiment of components design of the improved cross-polarized antennas system of FIG. 21.

FIG. 21 shows an embodiment of an improved cross-polarized antennas system with vertical sectorization. FIG. 22 shows an embodiment of components design of the improved cross-polarized antennas system of FIG. 21. The design allows the beams at the two columns 2210 to be down tilted at different angles to support the 2 sectors (each column is set to a different down tilt angle). Each sector has two transmitters and two receivers at ±45° (2T2R)±45° cross-polarization. With the placement of the hybrid 2250 after PAs 2240, the output has a circular cross-polarization (using 90° hybrid) or a horizontal and vertical cross-polarization (using 180° hybrid). Therefore, a digital hybrid 2250 is also added before the PAs 2240 to undo the effect of the output hybrid 2250 and recover the ±45° cross-polarization. In some scenarios, the circular cross-polarization or horizontal and vertical cross-polarization can be used without adding the digital hybrid 2250 before the PAs 2240. Further, the two transmitters 2220 driving the same column 2210 may not need to be phase synchronized.

The system of FIG. 11 can also be used in MU-MIMO scenarios. MU-MIMO relies on low interference between simultaneously scheduled users to achieve satisfactory performance. The different down tilt angles of the two polarizations offer additional isolation between two simultaneously scheduled users compared with the standard 2T system (FIG. 1), and hence may provide better performance. In the standard 2T system, the contribution of dual layer transmission to the total system throughput is relatively low. This may be due to the lack of sufficient isolation between the two polarizations. Therefore, no performance gain is expected using the 2T system for MU-MIMO. With 3D beamforming capability of the X234 system (FIG. 11), the users at sufficiently different elevation and azimuth angles may be paired up to share the same spectral resource. The users may also use two separate polarizations, which can reduce their mutual interference. Thus, the X234 system can improve MU-MIMO gain. The MU-MIMO may have similar or better performance than the vertical sectorization technique, and requires no additional cell IDs, potentially reducing the operations, administration and management (OAM) overhead.

Figure 23:
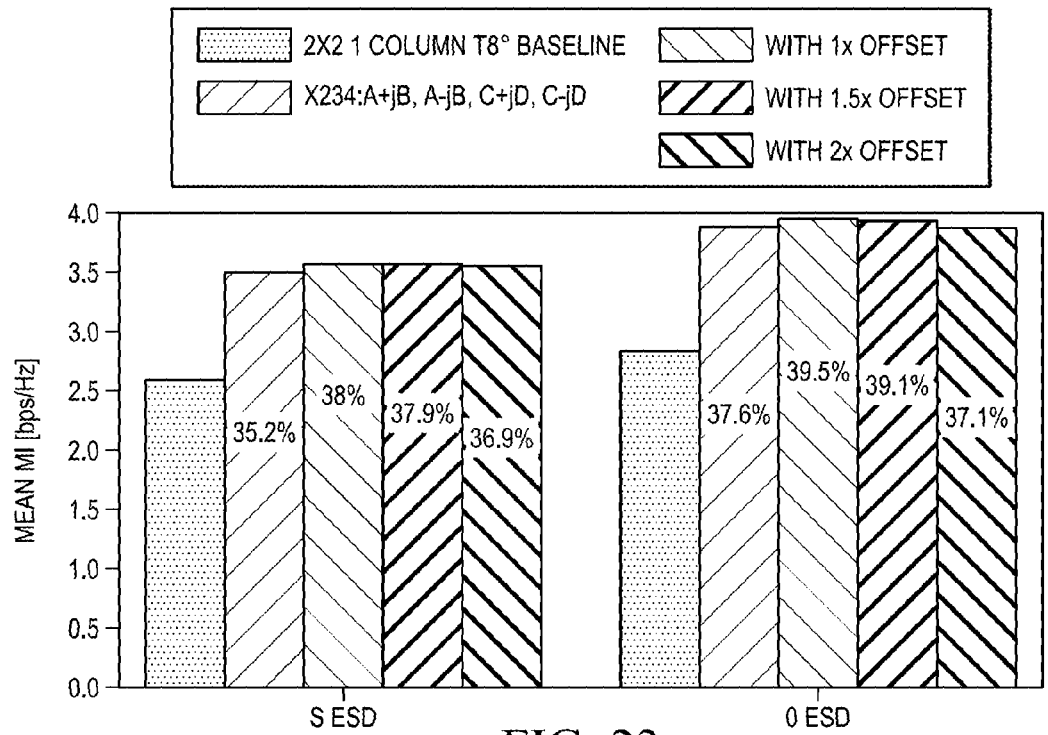
FIG. 23 is a chart illustrating simulation results of average user throughput for typical and improved cross-polarized antennas systems.
Figure 24:
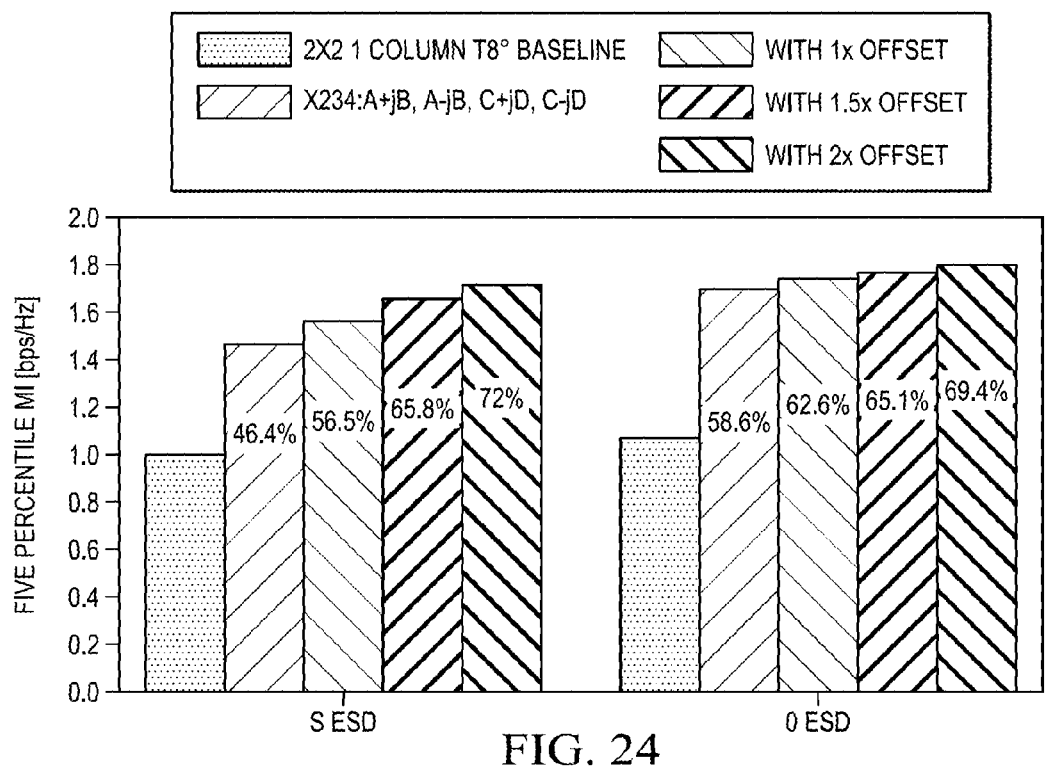
FIG. 24 is a chart illustrating simulation results of edge user throughput for typical and improved cross-polarized antennas systems.

FIGS. 23 and 24 show simulation results for various antenna systems including 2×2 Baseline (FIG. 1), X234, and X234 with intelligent PMI selection with different offset values. If the UE receiver can factor in the impact of its data beams to the rest of the network, and feedback the PMI which provides the best overall network throughput, the overall network edge performance can be significantly enhanced by more than about 10%. This can be accomplished by the UE receiver adding a PMI dependent offset to its calculation of the achievable throughput for all the PMI codewords.

As described above, the cross-polarized 2T user specific tilt (XP 2T UST) systems of FIGS. 3, 11, and 21 and their variations can increase downlink capacity and support vertical sectorization, MU-MIMO, and intelligent PMI selection with downlink performance gain. However, for the XP 2T UST systems, there is an additional coverage concern. Considering a user at the edge of the cell, in a standard 2T system (FIG. 1), both transmitters can transmit at full power to the user using the two cross-polarized antennas. In the XP 2T UST system, the system's signal can only be transmitted from the polarization with the lower down tilt angle. As such, if there is one power amplifier driving each polarization, only half of the total power is available for the edge user. All users in the system may suffer from this fact due to the structure of the codebook and the pilot beam. This coverage issue of the XP 2T UST system can be addressed via properly placing 90° or 180° hybrids in the system to allow power sharing between the different polarizations.

Figure 25:
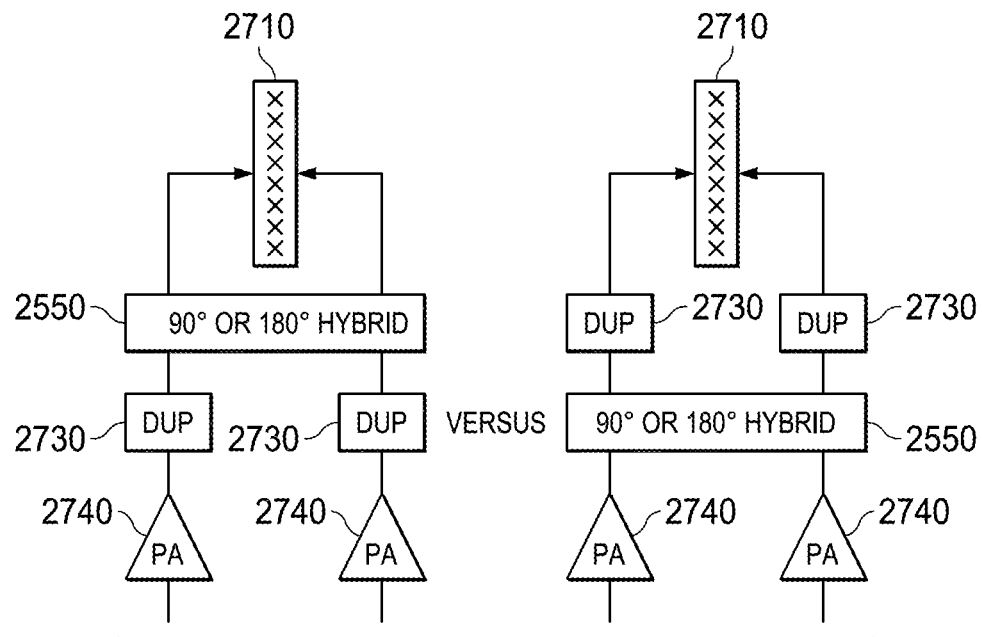
FIG. 25 is a diagram illustrating embodiments of optional designs of the improved cross-polarized antennas system of FIG. 3.
Figure 26:
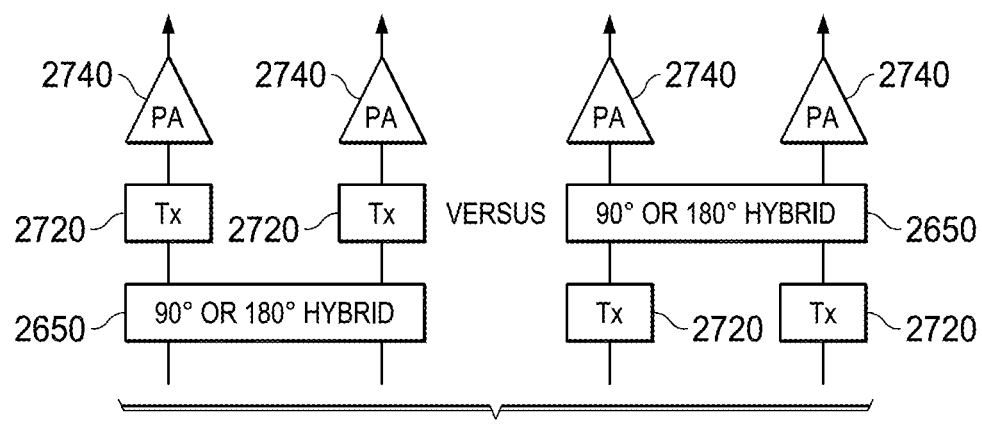
FIG. 26 is a diagram illustrating embodiments of optional designs of the improved cross-polarized antennas system of FIG. 3.
Figure 27:
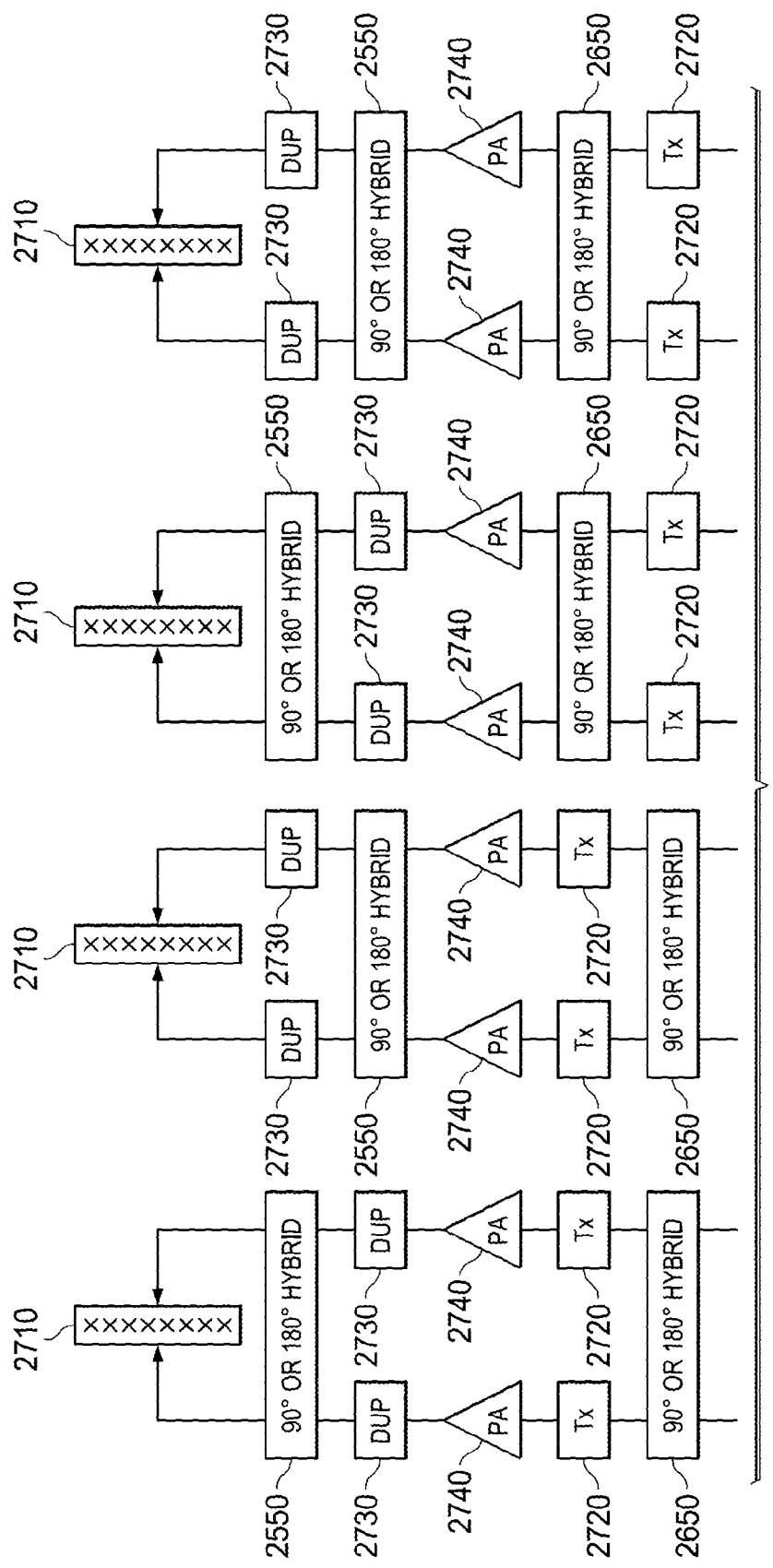
FIG. 27 is a diagram illustrating embodiments of optional designs of the improved cross-polarized antennas system of FIG. 3.

In embodiments, the 90° or 180° hybrids can be placed at the input and output of the two PAs to form a 2×2 Butler matrix. The Butler matrix enables both PAs to drive any single polarization. For example, when only one Tx is active, its output is split equally by the input hybrid to both PAs. The amplified signals are combined by the output hybrid into the corresponding polarization. There are two options for the location of the output hybrid 2550 as shown in FIG. 25, and two options for the location of the input hybrid 2650 as shown in FIG. 26, leading to 4 solution options as shown in FIG. 27.

25. In a first option, the output hybrid is placed between the DUPs and the PAs. This may only affect the transmit signal, and may only need to cover the Tx band. In a second option, the output hybrid is placed between the DUPs and the antennas column. This affects both the transmit and receive signal, and needs to cover both DUP bands. The first option may be preferred. The input hybrid can also have two locations as shown in FIG. 26. In a first option, the input hybrid is placed between the PAs and the signal RF transmitters. This is an analog implementation, not amenable to Digital Pre-Distortion (DPD). In a second option, the input hybrid is placed before the signal RF transmitters in the digital domain. This is compatible with DPD, and requires phase matching of the two branches of the analog transmitter chain and PA. The second option may be preferred. FIG. 27 shows the 4 solution options.

Figure 28:
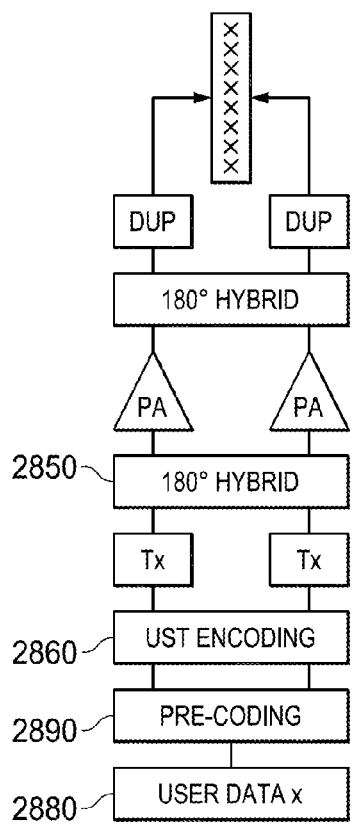
FIG. 28 is a diagram illustrating another embodiment of components design of the improved cross-polarized antennas system of FIG. 3.

FIG. 28 shows another embodiment of components design of the improved cross-polarized antennas system of FIG. 3. The design includes input and output 180° hybrids 2850 and baseband components including UST encoding 2860, precoding 2890, and user data (x) 2880. Table 5 below shows the signal to each stage (or component) in the design. In order for the PA powers to be balanced for all codes, the parameter $\phi$ is set to 0 or $\pi$. One option is to set Port1=A+B, Port2=A−B, for $\phi$=0. Another option is to set Port1=A−B, Port2=A+B, for $\phi$=$\pi$.

TABLE 5

| Signals to components of the design of FIG. 28 | | | | | | | |
|---|---|---|---|---|---|---|---|
| 2T Precoding Codebook | Precoding output | | UST Encoding Output | | Input Hybrid (180°) Output/ PA Input | | Output Hybrid (180°) Output/ Antenna Input |
| (1 layer) | PO1 | PO2 | Tx1 | Tx2 | PA1 | PA2 | +45° pol | −45° pol |
| [1, 1] | x | x | 2x | 0 | x | x | 2x | 0 |
| [1, −1] | x | −x | 0 | $2xe^{i\phi}$ | $xe^{i\phi}$ | $-xe^{i\phi}$ | 0 | $2xe^{i\phi}$ |
| [1, j] | x | jx | (1 + j)x | $(1 - j)xe^{i\phi}$ | $(1 + j)(1 - je^{i\phi})x/2$ | $((1 + j)(1 + je^{i\phi})x/2$ | (1 + j)x | $(1 - j)xe^{i\phi}$ |
| [1, −j] | x | −jx | (1 − j)x | $(1 + j)xe^{i\phi}$ | $(1 - j)(1 + je^{i\phi})x/2$ | $((1 - j)(1 - je^{i\phi})x/2$ | (1 − j)x | $(1 + j)xe^{i\phi}$ |

It is noted that for $\phi$=0, the precoding output is identical with PA input. Effectively, the UST encoding 2860 and the input hybrid 2850 cancel each other out. The implementation can be simplified by the design shown in FIG. 29. The design includes an output 180° hybrid 2950 and baseband components including precoding 2960 and user data (x) 2980. Table 6 below shows the signal to each stage in this design.

TABLE 6

Figure 29:
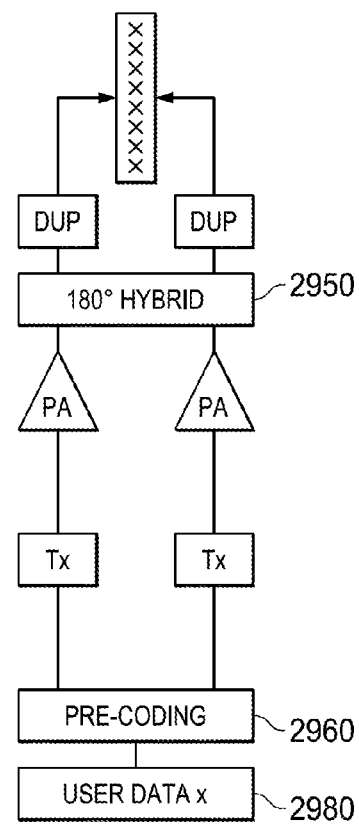
FIG. 29 is a diagram illustrating another embodiment of components design of the improved cross-polarized antennas system of FIG. 3.

| Signals to components of the design of FIG. 29 | | | | | | | |
|---|---|---|---|---|---|---|---|
| 2T Precoding Codebook | Precoding output | | UST Encoding Output | | Input Hybrid (180°) Output/ PA Input | | Output Hybrid (180°) Output/ Antenna Input |
| (1 layer) | PO1 | PO2 | Tx1 | Tx2 | PA1 | PA2 | +45° pol | −45° pol |
| [1, 1] | x | x | 2x | 0 | x | x | 2x | 0 |
| [1, −1] | x | −x | 0 | 2x | x | −x | 0 | 2x |
| [1, j] | x | jx | (1 + j)x | (1 − j)x | x | jx | (1 + j)x | (1 − j)x |
| [1, −j] | x | −jx | (1 − j)x | (1 + j)x | x | −jx | (1 − j)x | (1 + j)x |

The output hybrid 2250, which may be a passive circuit, can be integrated together with the DUPs to save cost and ensure performance in terms of insertion loss and phase accuracy. There are two possible locations as shown in FIG.

Figure 30:
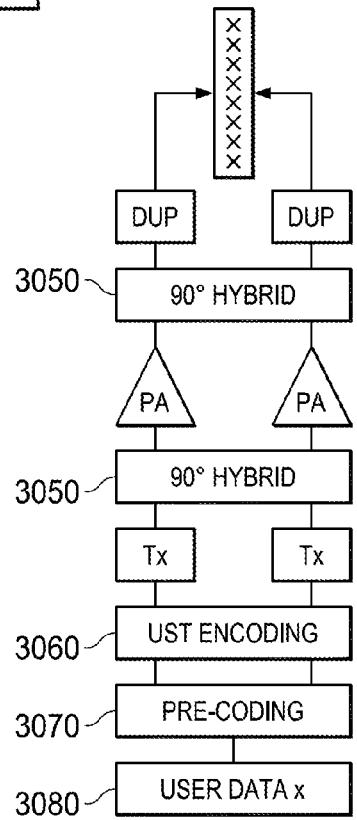
FIG. 30 is a diagram illustrating another embodiment of components design of the improved cross-polarized antennas system of FIG. 3.

FIG. 30 shows another embodiment of components design of the improved cross-polarized antennas system. The design includes input and output 90° hybrids 3050 and baseband components including UST encoding 3060, precoding 3070, and user data (x) 3080. Table 7 below shows the signal to each stage in the design. In order for the PA powers to be balanced for all codes, the parameter $\phi$ is set to $\pm\pi/2$. One option is to set Port 1=A+jB, Port2=A−jB, for $\phi=\pi/2$. Another option is to set Port 1=A−jB, Port2=A+jB, for $\phi=-\pi/2$.

TABLE 7

Signals to components of the design of FIG. 30

| 2T Precoding Codebook | Precoding output | | UST Encoding Output | | Input Hybrid (180°) Output/ PA Input | | Output Hybrid (180°) Output/ Antenna Input | |
|---|---|---|---|---|---|---|---|---|
| (1 layer) | PO1 | PO2 | Tx1 | Tx2 | PA1 | PA2 | +45° pol | −45° pol |
| [1, 1] | x | x | 2x | 0 | x | jx | 2jx | 0 |
| [1, −1] | x | −x | 0 | $2xe^{i\phi}$ | $jxe^{i\phi}$ | $xe^{i\phi}$ | 0 | $2jxe^{i\phi}$ |
| [1, j] | x | jx | (1 + j)x | $(1 − j)xe^{i\phi}$ | $(1 + j)(1 + e^{i\phi})x/2$ | $(−1 + j)(1 − e^{i\phi})x/2$ | (−1 + j)x | $(1 + j)xe^{i\phi}$ |
| [1, −j] | x | −jx | (1 − j)x | $(1 + j)xe^{i\phi}$ | $(1 − j)(1 − e^{i\phi})x/2$ | $((1 + j)(1 + e^{i\phi})x/2$ | (1 + j)x | $(−1 + j)xe^{i\phi}$ |

It is noted that for $\phi=\pi/2$, the precoding output is not identical with PA input. The antenna input is the same as the UST encoding 3060 output but with a 90° phase shift. However, the UST encoding 3060 and input hybrid 3050 processing can be combined in the digital domain. The implementation can be simplified by the design shown in FIG. 31. The design includes an output 90° hybrid 3150 and baseband components including a combined 90° and UST encoding 3165, precoding 3170, and user data (x) 3180. Table 8 below shows the signal to each stage in this design.

TABLE 8

Figure 31:
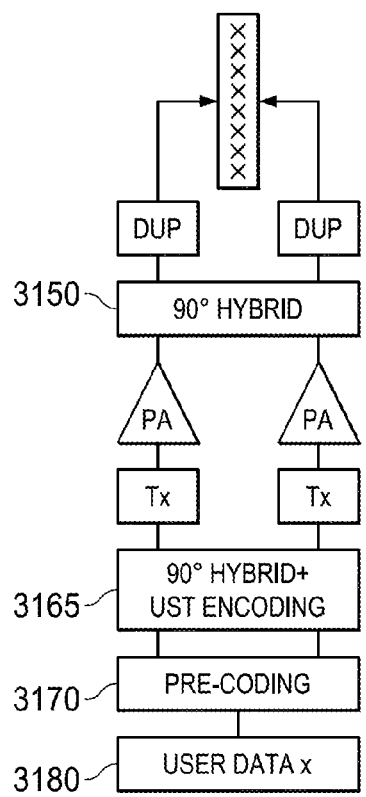
FIG. 31 is a diagram illustrating another embodiment of components design of the improved cross-polarized antennas system of FIG. 3.

Signals to components of the design of FIG. 31

| 2T Precoding Codebook | Precoding output | | UST Encoding Output | | Input Hybrid (180°) Output/ PA Input | | Output Hybrid (180°) Output/ Antenna Input | |
|---|---|---|---|---|---|---|---|---|
| (1 layer) | PO1 | PO2 | Tx1 | Tx2 | PA1 | PA2 | +45° pol | −45° pol |
| [1, 1] | x | x | 2x | 0 | x | jx | 2jx | 0 |
| [1, −1] | x | −x | 0 | 2jx | −x | jx | 0 | −2x |
| [1, j] | x | jx | (1 + j)x | (1 + j)x | jx | jx | (−1 + j)x | (−1 + j)x |
| [1, −j] | x | −jx | (1 − j)x | (−1 + j)x | −jx | jx | (1 + j)x | −(1 + j)x |

It is further noted that the PA input is similar to the pre-coding output but with a 90° phase shift, PA1 and PA2 swap, and a rearranged sequence. Since the codewords are determined based on the feedback from the UE, the rearranged sequence has no impact on the operation of the system. Therefore the implementation can be further simplified by the design shown in FIG. 32. The design includes an output 90° hybrid 3250 and baseband components including precoding 3270 and user data (x) 3280. Table 9 below shows the signal to each stage in this design.

In the embodiment systems above, the down tilt angles of transmit and receive are tied together. As such, when the two polarizations have different down tilt angles, the diversity receive performance may be compromised for users experiencing large imbalance between the two polarizations. This may be a problem for a noise limited environment, such as rural environment, than for an interference limited environment. In the interference limited environment, the performance of the uplink may even be improved. This issue can be addressed by adding more receivers on the uplink. Instead of using 2 transmitters and two receivers (2T2R), a 2 transmitters and 4 receivers (2T4R) implementation can be used. The system components can be separated into two groups feeding the extra 2 receivers. A new 1T2R duplexer design is also needed. For multi-band applications, even for 2T, the system may have 2 columns to support independent tilt for two bands. This offers opportunity to implement 2T4R and eliminate the diversity issue.

Figure 33:
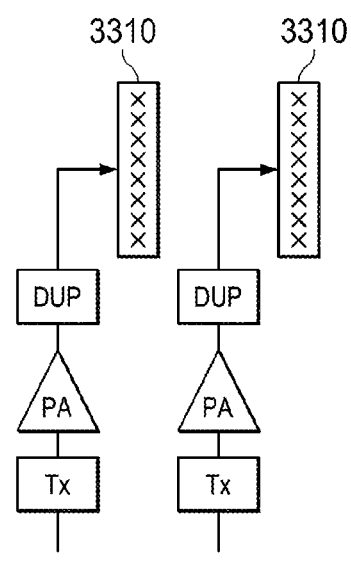
FIG. 33 is a diagram illustrating an embodiment of components design of the improved cross-polarized antennas system of FIG. 11 using two columns.
Figure 34:
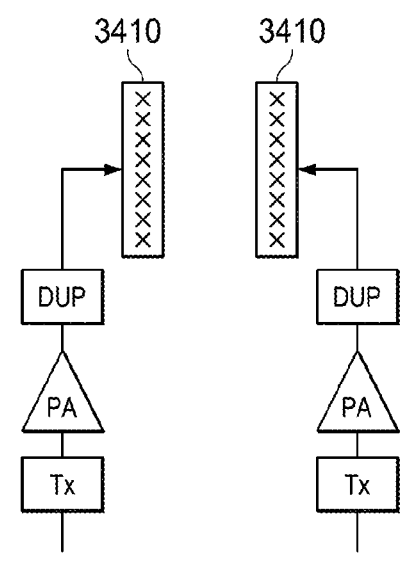
FIG. 34 is a diagram illustrating another embodiment of components design of the improved cross-polarized antennas system of FIG. 11 using two columns.

In embodiments, 2 column antennas are used to implement 4R to enhance uplink performance. This enables additional 2T UST implementation options. The two beams of different down tilt can be established in two ways as shown in FIGS. 33 and 34. According to the design in FIG.

TABLE 9

Figure 32:
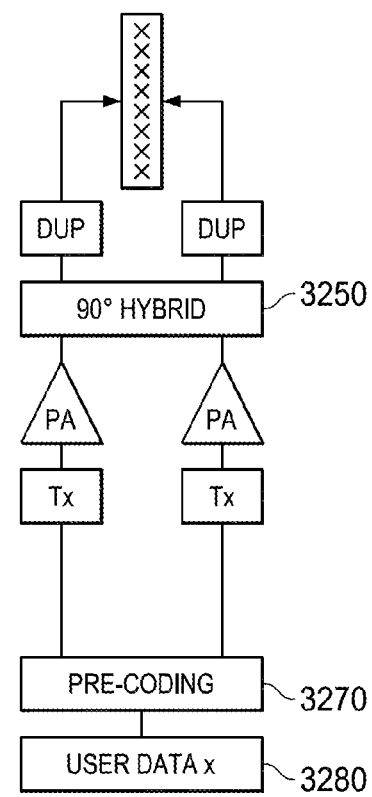
FIG. 32 is a diagram illustrating another embodiment of components design of the improved cross-polarized antennas system of FIG. 3.

Signals to components of the design of FIG. 32

| 2T Precoding Codebook | Precoding output | | UST Encoding Output | | Input Hybrid (180°) Output/ PA Input | | Output Hybrid (180°) Output/ Antenna Input | |
|---|---|---|---|---|---|---|---|---|
| (1 layer) | PO1 | PO2 | Tx1 | Tx2 | PA1 | PA2 | +45° pol | −45° pol |
| [1, 1] | x | x | 2x | 0 | x | jx | 2jx | 0 |
| [1, −1] | x | −x | 0 | 2jx | −x | jx | 0 | −2x |
| [1, j] | x | jx | (1 + j)x | (1 + j)x | jx | jx | (−1 + j)x | (−1 + j)x |
| [1, −j] | x | −jx | (1 − j)x | (−1 + j)x | −jx | jx | (1 + j)x | −(1 + j)x |

33, the same polarization is used on two separate columns 3310, avoiding the complexity/cost associated with a single column design. According to the design in FIG. 34, different polarizations are used on two separate columns 3410.

Figure 35:
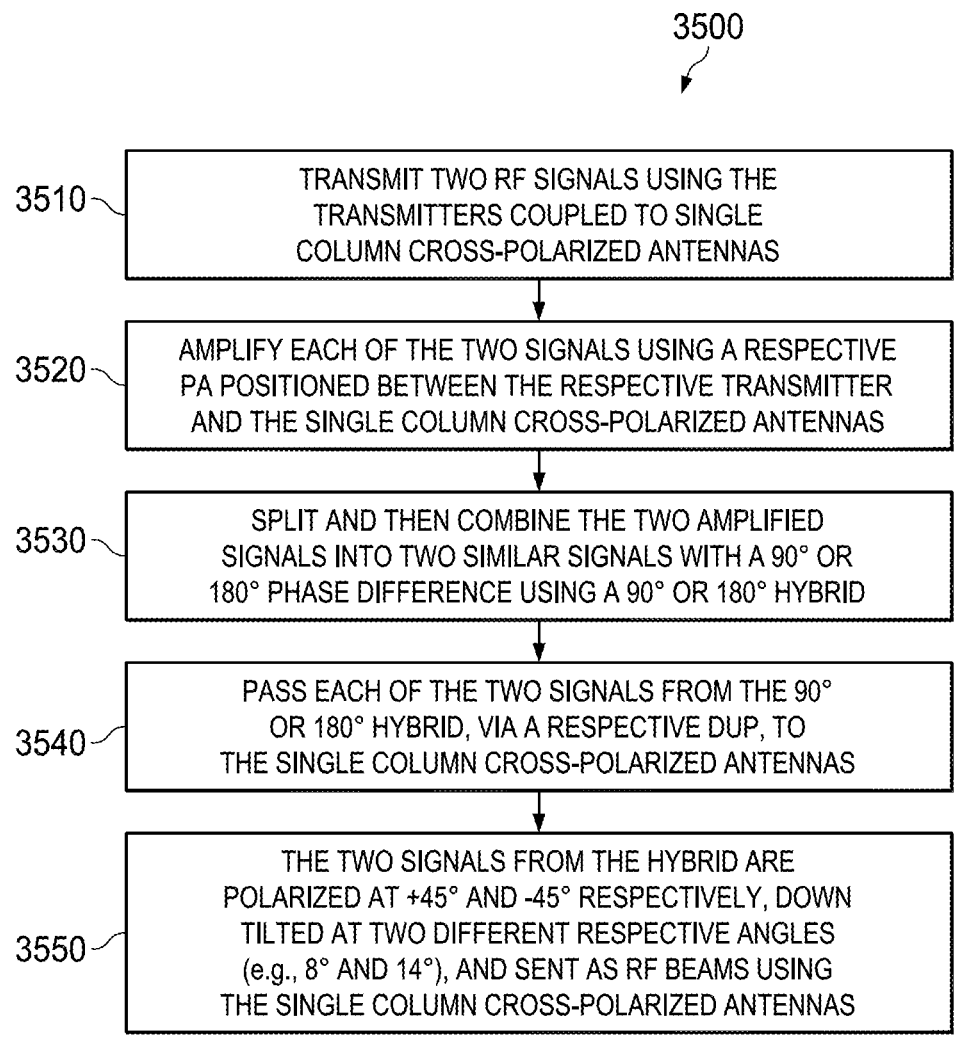
FIG. 35 is a flow diagram illustrating an embodiment of an operation method of the improved cross-polarized antennas system.

FIG. 35 is a flow diagram illustrating an embodiment of an operation method 3500 of the improved cross-polarized antennas systems described above. The method can be implemented for a single column or multiple column design, for single antenna or multiple antenna (MIMO) systems. Although the method is described according to the components design of FIG. 4, the method can be implemented by the other embodiments systems described above with suitable variation, addition, or reordering of the method steps. At step 3510, two RF signals are transmitted using the two transmitters coupled to single column cross-polarized antennas. At step 3520, each of the two signals is amplified using a respective PA positioned after the respective transmitter. At step 3530, the two amplified signals are split and then combined into two similar signals with a 90° or 180° phase difference using a 90° or 180° hybrid. At step 3540, each of the two signals from the 90° or 180° hybrid is passed, column via a respective DUP, to the single column cross-polarized antennas. The DUP on each of the two outputs of the hybrid serves to redirects signals transmitted to and received from the antenna column. At step 3550, the two signals from the hybrid are polarized at +45° and −45° respectively, down tilted at two different respective angles (e.g., 8° and 14°), and sent as RF beams using the single column cross-polarized antennas.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method performed by an antenna apparatus comprising:
   generating a pair of signals using a baseband digital circuit;
   upconverting the generated pair of signals using a pair of radio frequency (RF) transmitters coupled to the baseband digital circuit to outgoing RF signals;
   amplifying the outgoing RF signals using a pair of power amplifiers (PAs) coupled to the RF transmitters;
   phase shifting the amplified outgoing RF signals with a phase difference of 90° or 180° using a 90° or 180° hybrid coupler passive circuit coupled to the pair of PAs;
   polarizing the phase shifted signals at two different polarizations using single-column cross-polarized antennas coupled to the PAs;
   directing the polarized signals at different down tilt angles using the single-column cross-polarized antennas; and
   transmitting the directed polarized signals as RF beams using the single-column cross-polarized antennas.

2. The method of claim 1, further comprising duplexing the phase shifted signals.

3. The method of claim 1 further comprising phase shifting the upconverted signals an additional 90° or 180° using a second 90° or 180° hybrid coupler passive circuit after upconverting the signals using the RF transmitters and prior to amplifying the outgoing RF signals using the PAs.

4. The method of claim 3, wherein generating the pair of signals using the baseband digital circuit comprises:
   precoding user data; and
   encoding the precoded user data in accordance with the directing of the polarized signals.

5. The method of claim 1, further comprising phase shifting the generated signals using a 90° or 180° hybrid coupler digital signal processing component prior to upconverting the generated signals using the RF transmitters.

6. The method of claim 1 further comprising:
   generating a second pair of signals using the baseband digital circuit;
   upconverting the generated second pair of signals using a second pair of respective radio frequency (RF) transmitters coupled to the baseband digital circuit to second outgoing RF signals;
   amplifying the second outgoing RF signals using a second pair of respective power amplifiers (PAs) coupled to a second pair of RF transmitters;
   phase shifting the amplified second signals with a 90° or 180° phase difference using a second 90° or 180° hybrid coupler function block coupled to the second pair of RF transmitters;
   after the phase shifting the amplified second outgoing RF signals, polarizing the phase shifted second signals at two different polarizations using second single-column cross-polarized antennas coupled to the second pair of PAs;
   directing the polarized second signals at different angles using the second single-column cross-polarized antennas; and
   sending the directed second signals as RF beams using the second single-column cross-polarized antennas.

7. The method of claim 1, wherein generating the pair of signals further comprises pre-coding the pair of signals using a standard precoding method for multiple-input and multiple-output (MIMO) in Long Term Evolution (LTE) communications.

8. The method of claim 1, wherein the antenna apparatus is part of a base transceiver station (BTS) communicating with a user equipment (UE), wherein generating the pair of signals further comprises pre-coding the pair of signals in accordance with intelligent Precoding Matrix Indicator (PMI) feedback from the UE, wherein the intelligent PMI feedback includes a PMI dependent offset added to UE calculations of achievable throughput for all PMI codewords, and wherein the PMI dependent offset factors in an impact of data beams for the UE to neighboring cells.

9. An antenna apparatus comprising:
   a baseband signal processor;
   a pair of radio frequency (RF) transmitters coupled to the baseband signal processor;

a pair of power amplifiers (PAs) coupled to the pair of RF transmitters;

a 90° or 180° hybrid coupler coupled to the pair of RF transmitters, wherein the 90° or 180° hybrid coupler is positioned after the pair of PAs, wherein the 90° or 180° hybrid coupler is a RF circuit that introduces a 90° or 180° phase difference between two incoming signals from the pair of PAs;

a pair of duplexers (DUPs) coupled in series with the pair of PAs and in series with the 90° or 180° hybrid coupler; and two cross-polarization antennas coupled to the pair of PAs, wherein the two cross-polarization antennas down tilt phase difference outputs from the 90° or 180° hybrid coupler at different down tilt angles, and wherein the 90° or 180° hybrid coupler and the pair of DUPs are positioned between the pair of PAs and the two cross-polarization antennas.

10. The antenna apparatus of claim 9, wherein the two cross-polarization antennas are on a single column of antennas.

11. The antenna apparatus of claim 9, wherein a first cross-polarization antenna of the two cross-polarization antennas is on one column, and wherein a second cross-polarization antenna of the two cross-polarization antennas is on another column.

12. The antenna apparatus of claim 9, wherein the 90° or 180° hybrid coupler is positioned between the pair of DUPs and the pair of PAs.

13. The antenna apparatus of claim 12 further comprising a second 90° or 180° hybrid coupler positioned between the pair of RF transmitters and the pair of PAs.

14. The antenna apparatus of claim 13, wherein the baseband signal processor comprises:
a user specific tilt (UST) encoding block coupled to the pair of RF transmitters; and
a data precoding block coupled to the UST encoding block.

15. The antenna apparatus of claim 12 further comprising a second 90° or 180° hybrid coupler positioned between the pair of RF transmitters and the baseband signal processor.

16. The antenna apparatus of claim 12, wherein the 90° or 180° hybrid coupler is a 90° hybrid coupler, and wherein the baseband signal processor comprises:
a combined 90° hybrid coupler and user specific tilt (UST) encoding block coupled to the pair of RF transmitters; and
a data precoding block coupled to the UST encoding block.

17. The antenna apparatus of claim 9, further comprising a second 90° or 180° hybrid coupler positioned between the pair of RF transmitters and the baseband signal processor.

18. The antenna apparatus of claim 9, further comprising a second 90° or 180° hybrid coupler positioned between the pair of RF transmitters and the pair of PAs.

19. The antenna apparatus of claim 9, wherein the 90° or 180° hybrid coupler is positioned between the pair of DUPs and the two antennas.

20. The antenna apparatus of claim 19 further comprising a second 90° or 180° hybrid coupler positioned between the pair of RF transmitters and the baseband processor.

21. The antenna apparatus of claim 19 further comprising a second 90° or 180° hybrid coupler positioned between the pair of RF transmitters and the pair of PAs.

22. An antenna apparatus comprising:
a baseband signal processor including four output ports;
a first pair of radio frequency (RF) transmitters coupled to first two ports of the four output ports;
a second pair of RF transmitters coupled to second two ports of the four output ports;
a first pair of power amplifiers (PAs) coupled to the first pair of RF transmitters;
a second pair of PAs coupled to the second pair of RF transmitters;
a first 90° or 180° hybrid coupler coupled to the first pair of RF transmitters, wherein the first 90° or 180° hybrid coupler is positioned after the first pair of PAs, wherein the first 90° or 180° hybrid coupler is a first RF circuit that introduce a 90° or 180° phase difference between two incoming signals from the first pair of PAs;
a second 90° or 180° hybrid coupler coupled to the second pair of RF transmitters, wherein the second 90° or 180° hybrid coupler is positioned after the second pair of PAs, and wherein the second 90° or 180° hybrid coupler is a second RF circuit that introduce a 90° or 180° phase difference between two incoming signals from the second pair of PAs;
a first pair of duplexers (DUPs) coupled in series with the first pair of PAs and in series with the first 90° or 180° hybrid coupler;
a second pair of DUPs coupled in series with the second pair of PAs and in series with the second 90° or 180° hybrid coupler;
first cross-polarization antennas on a first column coupled to the first pair of PAs, wherein the first pair of DUPs and the first 90° or 180° hybrid coupler are positioned between the first pair of PAs and the first cross-polarization antennas, and wherein the first cross-polarized antennas down tilt phase difference outputs from the first 90° or 180° hybrid coupler at different down tilt angles; and
second cross-polarization antennas on a second column coupled to the second pair of PAs, wherein the second pair of DUPs and the second 90° or 180° hybrid coupler are positioned between the second pair of PAs and the second cross-polarization antennas, and wherein the second cross-polarized antennas down tilt phase difference outputs from the second 90° or 180° hybrid coupler at different down tilt angles.

23. The antenna apparatus of claim 22, wherein the first 90° or 180° hybrid coupler is positioned between the first pair of DUPs and the first pair of PAs, and wherein the second 90° or 180° hybrid coupler is positioned between the second pair of DUPs and the second pair of PAs.

24. The antenna apparatus of claim 22, wherein a first antenna of the first cross-polarization antennas has same polarization and down tilt angle of a first antenna of the second cross-polarization antennas, and wherein a second antenna of the first cross-polarization antennas has same polarization and down tilt angle of a second antenna of the second cross-polarization antennas.

25. The antenna apparatus of claim 22, wherein the antenna apparatus further comprises:
a third 90° or 180° hybrid coupler positioned between the first pair of the RF transmitters and the baseband signal processor; and
a fourth 90° or 180° hybrid coupler positioned between the second pair of the RF transmitters and the baseband signal processor.

* * * * *